(12) United States Patent
Ito et al.

(10) Patent No.: US 9,018,807 B2
(45) Date of Patent: Apr. 28, 2015

(54) INVERTER DEVICE

(75) Inventors: Kohei Ito, Nagoya (JP); Tatsuya Kondo, Okazaki (JP); Tomoyuki Suzuki, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 691 days.

(21) Appl. No.: 13/418,822

(22) Filed: Mar. 13, 2012

(65) Prior Publication Data

US 2012/0248909 A1    Oct. 4, 2012

(30) Foreign Application Priority Data

Mar. 31, 2011    (JP) ................. 2011-080708

(51) Int. Cl.
  *H02K 9/22*    (2006.01)
  *H02K 5/18*    (2006.01)
  *H02M 7/00*    (2006.01)
  *H02K 11/00*   (2006.01)
  *H05K 7/20*    (2006.01)

(52) U.S. Cl.
  CPC ............... *H02M 7/003* (2013.01); *H02K 5/18* (2013.01); *H02K 11/0073* (2013.01); *H05K 7/20918* (2013.01)

(58) Field of Classification Search
  USPC .................................................. 310/64, 71, 89
  IPC .................................................. H02K 5/18,9/22
  See application file for complete search history.

(56) References Cited

U.S. PATENT DOCUMENTS

| | | | |
|---|---|---|---|
| 5,006,744 A * | 4/1991 | Archer et al. .................. 310/89 |
| 5,939,807 A * | 8/1999 | Patyk et al. .................... 310/89 |
| 2003/0200761 A1 | 10/2003 | Funahashi et al. | |
| 2005/0223727 A1 | 10/2005 | Funahashi et al. | |
| 2006/0064998 A1 | 3/2006 | Funahashi et al. | |
| 2008/0049477 A1 | 2/2008 | Fujino et al. | |
| 2008/0266811 A1 | 10/2008 | Yamada et al. | |
| 2010/0284838 A1 | 11/2010 | Ichise et al. | |

FOREIGN PATENT DOCUMENTS

| | | |
|---|---|---|
| JP | A-06-245542 | 9/1994 |
| JP | A-07-115778 | 5/1995 |
| JP | A-09-047035 | 2/1997 |
| JP | A-2003-324903 | 11/2003 |

(Continued)

OTHER PUBLICATIONS

Jun. 5, 2012 International Search Report issued in International Patent Application No. PCT/JP2012/054613 (with translation).

*Primary Examiner* — Dang Le
(74) *Attorney, Agent, or Firm* — Oliff PLC

(57) ABSTRACT

An inverter includes a plurality of switching elements that convert between DC and AC power. A base plate includes a surface on which the switching elements are placed. Heat dissipating fins are provided on the opposite side of the base plate. Power is input and output through AC power terminals to and from a rotary electric machine to drive a vehicle. The terminals are electrically connected to the switching elements. A capacitor smoothes the DC power. The inverter is fixed to a case of the rotary electric machine. A rotating shaft of the rotary electric machine extends in a width direction of the vehicle. The base plate is disposed adjacent to the AC terminals in the width direction. A plurality of AC phase-terminals is sequentially arrayed perpendicular to the rotating shaft. The capacitor is disposed adjacent to the heat dissipating fins on the rear side of the vehicle.

25 Claims, 8 Drawing Sheets

(56) References Cited

FOREIGN PATENT DOCUMENTS

| JP | A-2004-214452 | 7/2004 |
| JP | A-2005-012940 | 1/2005 |
| JP | A-2008-029094 | 2/2008 |
| JP | A-2008-253041 | 10/2008 |
| JP | A-2009-165327 | 7/2009 |
| WO | WO 2007/080748 A1 | 7/2007 |
| WO | WO 2009/041461 A1 | 4/2009 |
| WO | WO 2010/146993 A1 | 12/2010 |

* cited by examiner

INVERTER DEVICE

INCORPORATION BY REFERENCE

The disclosure of Japanese Patent Application No. 2011-080708 filed on Mar. 31, 2011, including the specification, drawings and abstract thereof, is incorporated herein by reference in its entirety.

BACKGROUND OF THE INVENTION

1. Field of the Invention

The present invention relates to an inverter device including a plurality of switching elements that convert electric power between DC power and AC power, a base plate that includes an element placing surface on which these plurality of switching elements are placed, heat dissipating fins that are provided on the side of the base plate opposite to the element placing surface, AC terminals through which AC power is input and output to and from a rotary electric machine as a driving power source of a vehicle and which are electrically connected to the switching elements, and a capacitor that smoothes DC power.

2. Description of the Related Art

In recent years, a hybrid vehicle or an electric vehicle, which includes a rotary electric machine as a driving power source, has come into the spotlight in terms of energy saving or the reduction of environmental burden. There are many cases where a DC power source such as a high-voltage battery is generally provided and the rotary electric machine is driven by AC power in the hybrid vehicle or the like. For this reason, the hybrid vehicle or the like is provided with an inverter device between the DC power source and the rotary electric machine.

A device disclosed in, for example, the following JP-A-2008-29094 has already been known as the above-mentioned inverter device. Hereinafter, names and reference numerals of corresponding members disclosed in JP-A-2008-29094 will be quoted in square brackets in the description of the section of the background art. As shown in FIGS. 2 and 3 of JP-A-2008-29094, this device includes a base plate [motor substrate 120 and cooling fins 12] on which a plurality of switching elements [MOS-FETs 111a to 111f] are provided, heat dissipating fins [cooling fins 12] that are provided on the side opposite to the surface of the base plate on which the switching elements are placed, a plurality of AC phase-terminals [AC terminals 71, 72, and 73] through which AC power is input and output to and from a rotary electric machine [motor generator 940], and capacitors [electrolytic capacitors 21, 22, and 23] that smooth DC power.

In JP-A-2008-29094, the inverter device and the rotary electric machine are disposed so as to be distant from each other in the width direction of a vehicle. Further, the disposition of the plurality of AC phase-terminals, the heat dissipating fins, and the capacitors when the inverter device is mounted on the vehicle is not clearly described in JP-A-2008-29094. However, referring to FIGS. 2, 5, and 7 of JP-A-2008-29094 together, it is understood that the plurality of AC phase-terminals are sequentially arrayed in the direction parallel to a rotating shaft of the rotary electric machine and the capacitors are disposed on the front side of the heat dissipating fins in a travel direction of the vehicle.

However, in this structure, an electrical connection structure between the rotary electric machine and the plurality of AC phase-terminals of the inverter device is apt to be increased in size and become complicated. Further, in relation to the travel direction of the vehicle, the cooling fins are hidden in the shade of the capacitors that occupies a relatively large range in the direction perpendicular to the base plate. For this reason, there is a possibility that it is not possible to efficiently cool both the capacitors and the switching elements. That is, when the performance for cooling the components (the switching elements, the capacitors, or the like) of the inverter device or the electrical connection between the inverter device and the rotary electric machine as a driving power source of the vehicle is considered, the disposition of the respective components of the inverter device disclosed in JP-A-2008-29094 is not necessarily optimized.

SUMMARY OF THE INVENTION

Accordingly, it is desirable to optimize the disposition of respective components in an inverter device connected to a rotary electric machine as a driving power source of a vehicle so that an electrical connection structure between the inverter device and the rotary electric machine is simplified and cooling performance is secured.

According to the invention, there is provided an inverter device including a plurality of switching elements that convert electric power between DC power and AC power, a base plate that includes an element placing surface on which these plurality of switching elements are placed, heat dissipating fins that are provided on the side of the base plate opposite to the element placing surface, AC terminals through which the AC power is input and output to and from a rotary electric machine as a driving power source of a vehicle and which are electrically connected to the switching elements, and a capacitor that smoothes DC power. The inverter device is fixed to a rotary electric machine case that receives the rotary electric machine. The structure of the inverter device is characterized in that a rotating shaft of the rotary electric machine is disposed so as to extend in a width direction of the vehicle, the base plate is disposed adjacent to the AC terminals in the width direction of the vehicle, a plurality of AC phase-terminals as the AC terminals are sequentially arrayed in a direction perpendicular to the rotating shaft of the rotary electric machine, and the capacitor is disposed adjacent to the heat dissipating fins on the rear side in a travel direction of the vehicle.

According to the characteristic structure, the plurality of AC phase-terminals as the AC terminals are disposed on the same side of the base plate in the width direction of the vehicle while being sequentially arrayed in a direction perpendicular to the rotating shaft of the rotary electric machine that is disposed so as to extend in the width direction of the vehicle. Accordingly, since it is possible to connect the plurality of AC phase-terminals to the coils of the rotary electric machine on the same side in the axial direction of the rotating shaft of the rotary electric machine, it is possible to simplify an electrical connection structure between the inverter device and the rotary electric machine. Further, since the capacitor is disposed adjacent to the heat dissipating fins on the rear side in the travel direction of the vehicle, it is possible to cool the switching elements by dissipating heat from the heat dissipating fins by travel wind generated due to the forward travel of the vehicle and also to cool the capacitor by guiding the travel wind to the capacitor. Therefore, according to the above-mentioned characteristic structure, it is possible to optimize the disposition of respective components in an inverter device connected to the rotary electric machine as the driving power source of the vehicle, so that it is possible to simplify an electrical connection structure between the inverter device and the rotary electric machine and to secure cooling performance.

Here, the heat dissipating fins may be disposed on the side opposite to the rotary electric machine with respect to the element placing surface.

According to this structure, the heat dissipating fins are disposed on the side opposite to the rotary electric machine and the rotary electric machine case with respect to the element placing surface. Accordingly, as compared to a case where the heat dissipating fins are disposed on the same side as the rotary electric machine and the rotary electric machine case with respect to the element placing surface, the heat dissipating fins are not easily affected by heat generated by the rotary electric machine and cooling air is easily supplied to the heat dissipating fins. Therefore, it is possible to more efficiently dissipate heat from the base plate by the heat dissipating fins.

Further, an extending direction of the heat dissipating fins, which extend in the shape of a flat plate, may be set so as to be a direction along a travel direction of the vehicle.

According to this structure, it is possible to efficiently guide travel wind, which flows between the heat dissipating fins, to the capacitor. Accordingly, it is possible to efficiently cool the capacitor.

Furthermore, the inverter device may further include power supply terminals which are connected to the capacitor and through which the DC power is input and output to and from a DC power source, and the power supply terminals may be disposed on the rear side of the capacitor in the travel direction of the vehicle.

According to this structure, the power supply terminals are disposed on the rear side of the capacitor in the travel direction of the vehicle. Accordingly, among the respective components of the inverter device, it is possible to dispose the power supply terminals at the rearmost end portion of the vehicle in the travel direction. Therefore, it is easy to achieve the electrical connection between the power supply terminal and the DC power source, which is often mounted on the vehicle on the rear side of a driving power source receiving chamber in which a driving power source (which includes the rotary electric machine) of the vehicle is generally received, with the shortest path. As a result, it is possible to simplify the electrical connection structure between the inverter device and the DC power source.

Moreover, the plurality of AC phase-terminals may be disposed at positions that overlap coils of the rotary electric machine when seen in a radial direction of the rotary electric machine.

Meanwhile, in regard to the disposition of two members, "overlap when seen in a predetermined direction" means that a viewing point where the two members overlap each other is present in at least a part of an area when the predetermined direction is used as a viewing direction and the viewing point is moved in each direction perpendicular to the viewing direction.

According to this structure, it is possible to connect the plurality of AC phase-terminals to the coils of the rotary electric machine in the radial direction of the rotary electric machine in the shape of a straight line and to electrically connect the AC phase-terminals to the coils by a minimum number of necessary members. Therefore, it is possible to simplify the electrical connection structure between the inverter device and the coils.

Further, the AC terminals may be disposed so as to protrude from the base plate in a predetermined first reference direction in plan view seen in a direction perpendicular to the element placing surface; the capacitor may be disposed in a capacitor disposition area that is set in a rectangular shape in the plan view; and the capacitor disposition area may be set so that long sides of the rectangular shape are parallel to the first reference direction in the plan view, and may be set adjacent to a base disposition area, in which the base plate and the AC terminals are disposed, in a second reference direction that is a direction perpendicular to the first reference direction.

Meanwhile, the "rectangular shape" is used as a concept that represents a shape regarded as a substantially rectangular shape as a whole even though there are some deformed portions.

According to this structure, the base disposition area, in which the base plate and the AC terminals disposed so as to protrude from the base plate in the first reference direction are disposed, and the rectangular capacitor disposition area, in which the capacitor is disposed and which has long sides parallel to the first reference direction, are disposed adjacent to each other in the second reference direction in plan view seen in a direction perpendicular to the element placing surface. That is, the base plate, the AC terminals, and the capacitor are not sequentially arrayed in the first reference direction, and the capacitor is disposed adjacent to the base plate and the AC terminals in the second reference direction. Accordingly, it is possible to compactly dispose all of the base plate, the AC terminals, and the capacitor in an area, which has a rectangular shape in plan view, by setting the positions of both end portions of the capacitor disposition area in the first reference direction in accordance with the positions of both end portions of the base disposition area in the first reference direction. Therefore, it is possible to provide an inverter device of which the entire size can be reduced.

Meanwhile, the capacitor has a relatively large degree of freedom in the design of the size and shape thereof, as compared to the AC terminals that input and output AC power to and from the external device or the base plate on which the switching elements are provided. For this reason, it is possible to adjust the size and shape of the capacitor in accordance with the size and shape of the capacitor disposition area, so that the above-mentioned inverter device can be appropriately provided.

Furthermore, the length of the capacitor disposition area in the first reference direction may be set so as to be longer than the length of the base plate in the first reference direction, and the AC terminals may be disposed in an area overlapping the capacitor disposition area when seen in the second reference direction.

According to this structure, the AC terminals are disposed so as to be received in the area that is formed due to the difference between the length of the capacitor disposition area and the length of the base plate in the first reference direction. Accordingly, it is possible to compactly dispose all of the base plate, the AC terminals, and the capacitor.

Moreover, a connecting support, which supports electrical connection members electrically connecting at least the switching elements to the AC terminals, may be provided on the same side of the base plate as the element placing surface; the base disposition area may be set so as to include disposition areas for the heat dissipating fins and the connecting support; and the length and position of the capacitor disposition area in a perpendicular reference direction, which is a direction perpendicular to the element placing surface, may be set so as to correspond with the length and position of the base disposition area in the perpendicular reference direction.

Meanwhile, "correspond" is used as a concept representing that events (which include length and a position), that is, objects to be compared are substantially the same as each other. That is, "correspond" includes not only a state where events, that is, objects to be compared are exactly the same as each other but also a state where there are differences between these events. For example, "correspond" also includes a state where differences between the events, that is, the objects to be compared are sufficiently small as compared to all of the events and the events are substantially the same as each other so that peripheral portions can be designed or manufactured, or a state where there are differences caused by allowable errors in design or manufacture.

According to this structure, it is possible to electrically connect the switching elements to the AC terminals while appropriately supporting the electrical connection members by the connecting support.

Furthermore, in the above-mentioned structure, the base disposition area is set so as to include disposition areas of the heat dissipating fins and the connecting support, and the length and position of the capacitor disposition area in the perpendicular reference direction are set so as to correspond with the length and position of the base disposition area in the perpendicular reference direction. For this reason, in terms of a positional relationship in the direction along the perpendicular reference direction, the capacitor can be disposed so as to be received in the area that is occupied by all of the base plate, the AC terminals, the heat dissipating fins, and the connecting support. Therefore, all of the base plate, the AC terminals, the heat dissipating fins, the connecting support, and the capacitor are easily disposed so as to be received in the area, which has a rectangular shape when seen in at least one of the first and second reference directions, without dead spaces. As a result, it is possible to provide an inverter device of which the entire size can be further reduced.

Moreover, the inverter device may further include a control board that is provided with at least a drive circuit for the switching elements. The control board may be adjacent to both the capacitor disposition area and the base disposition area in a perpendicular reference direction, which is a direction perpendicular to the element placing surface, and may be disposed at a position overlapping both the capacitor disposition area and the base disposition area in the plan view.

According to this structure, the control board is disposed adjacent to both the capacitor disposition area and the base disposition area without being significantly distant from both the capacitor disposition area and the base disposition area in the perpendicular reference direction. Accordingly, it is possible to suppress the increase of the size of the inverter device in the perpendicular reference direction. Further, since the control board is disposed at the position that overlaps both the capacitor disposition area and the base disposition area in the plan view (when seen in the perpendicular reference direction), all of the main components, which also include the control board, of the inverter device can be easily disposed so as to be received in the area that has a rectangular shape in the plan view.

Further, the inverter device may further include power supply terminals through which the DC power is input and output to and from a DC power source, DC terminals through which the DC power is input and output to and from the switching elements, and capacitor connecting members that electrically connect the power supply terminals to the DC terminals through the capacitor. The control board may further be provided with a voltage detecting circuit that detects a voltage between both electrodes of the capacitor. Branch connection portions, which may be branched from the capacitor connecting members and extend in the perpendicular reference direction, may be connected to the voltage detecting circuit while passing through the control board.

According to this structure, the branch connection portions, which are branched from the capacitor connecting members electrically connecting the power supply terminals to the DC terminals, extend in the perpendicular reference direction and pass through the control board. Accordingly, it is possible to connect the capacitor connecting members to the voltage detecting circuit over a short distance.

Furthermore, the power supply terminals and the DC terminals may be disposed at positions that are different in the first reference direction and point-symmetrical to each other with respect to the center of gravity of the shape of the capacitor disposition area in the plan view.

Meanwhile, "point-symmetry" is used as a concept that represents symmetry regarded as substantially point-symmetry as a whole even though there are some positional deviations.

As described above, in the structure where the capacitor disposition area is set adjacent to the base disposition area in the second reference direction, it is possible to set the positions of both end portions of the capacitor disposition area in the first reference direction in accordance with the positions of both end portions of the base disposition area in the first reference direction. For example, it is possible to make the length and position of the capacitor disposition area in the first reference direction correspond with the length and position of the base disposition area in the first reference direction. In this case, the area, in which the base plate is disposed, of the base disposition area in the first reference direction except for the AC terminal portions is an area that occupies only a predetermined range on one side of the capacitor disposition area. For this reason, the center of gravity of the shape of the base plate in plan view and the center of gravity of the shape of the capacitor disposition area (and the capacitor) in the plan view correspond to positions that are different from each other in the first reference direction. Meanwhile, considering the design or the like of the electrical connection members that electrically connect the DC terminals to the switching elements, it is preferable that the DC terminals, through which DC power is input and output to and from the switching elements, be disposed at the position of the center of gravity of the base plate in the first reference direction. In this case, the DC terminal and the center of gravity of the capacitor disposition area (and the capacitor) correspond to positions that are different from each other in the first reference direction.

In this structure, according to the above-mentioned structure, the power supply terminals and the DC terminals are disposed at positions that are different in the first reference direction and point-symmetrical to each other with respect to the center of gravity of the capacitor disposition area in the plan view. Accordingly, in the structure where a plurality of capacitor elements are connected between the power supply terminals and the DC terminals, it is possible to make the lengths of the electrical connection paths, which pass through the respective capacitor elements and the capacitor connecting members between the power supply terminals and the DC terminals, correspond with each other. Accordingly, it is possible to substantially equalize the currents that flow through the respective capacitor elements. Further, since the amount of heat generated by the respective capacitor elements is also substantially equalized due to this, it is possible to reduce the size of each of the capacitor elements and thus to reduce the entire size of the inverter device and the capacitor.

Furthermore, the plurality of switching elements may form an inverter circuit. The inverter circuit may have a three-leg structure including three legs that include switching elements forming upper stage arms connected to the side of a positive electrode and switching elements forming lower stage arms connected to the side of a negative electrode. A direction in which the upper and lower stage arms of each of the legs are connected to each other may be a direction along the first reference direction, and the three legs may be sequentially arrayed in the second reference direction.

According to this structure, it is possible to convert electric power between DC power and three-phase AC power by the inverter circuit having the three-leg structure.

In this case, in the above-mentioned structure, all of the direction in which the upper and lower stage arms of each of the legs are connected to each other and a direction in which the switching element and the AC terminal of each of the legs are connected to each other are the direction along the first reference direction. Accordingly, it is possible to simplify the shapes of the electrical connection members, which electrically connect the switching elements to the AC terminals, into the shape close to the shape of a straight line. Further, since it is possible to make the shapes of the electrical connection members for the respective phases correspond with each other, it is possible to simplify the disposition of the electrical connection members for the respective phases to the AC terminals.

Furthermore, since the three legs of which the upper and lower stage arms are disposed in the first reference direction are sequentially arrayed in the second reference direction, all of a direction in which the upper stage arm of the respective legs are connected to each other, a direction in which the lower stage arm of the respective legs are connected to each other, and a direction in which the legs are connected to the positive or negative electrodes of the DC terminals disposed on the side of the capacitor are the direction along the second reference direction. Accordingly, it is possible to simplify the shapes of the electrical connection members, which electrically connect the switching elements to the DC terminals, into the shape close to the shape of a straight line. Further, since it is possible to make the shapes of the electrical connection members for the respective phases correspond with each other, it is possible to simplify the disposition of the electrical connection members for the respective phases to the DC terminals.

Moreover, the upper and lower stage arms may be disposed so that a longitudinal direction of each of the upper and lower stage arms is a direction along the first reference direction.

According to this structure, it is possible to reduce the lengths of the electrical connection members for the respective phases in the second reference direction as compared to the case where the upper and lower stage arms are disposed so that the longitudinal direction of each of the upper and lower stage arms is a direction along the second reference direction. Therefore, it is possible to reduce the electrical resistance of the electrical connection members for the respective phases serving as the transmission path for DC power, so that it is possible to improve energy efficiency.

DETAILED DESCRIPTION OF THE EMBODIMENTS

Figure 1:
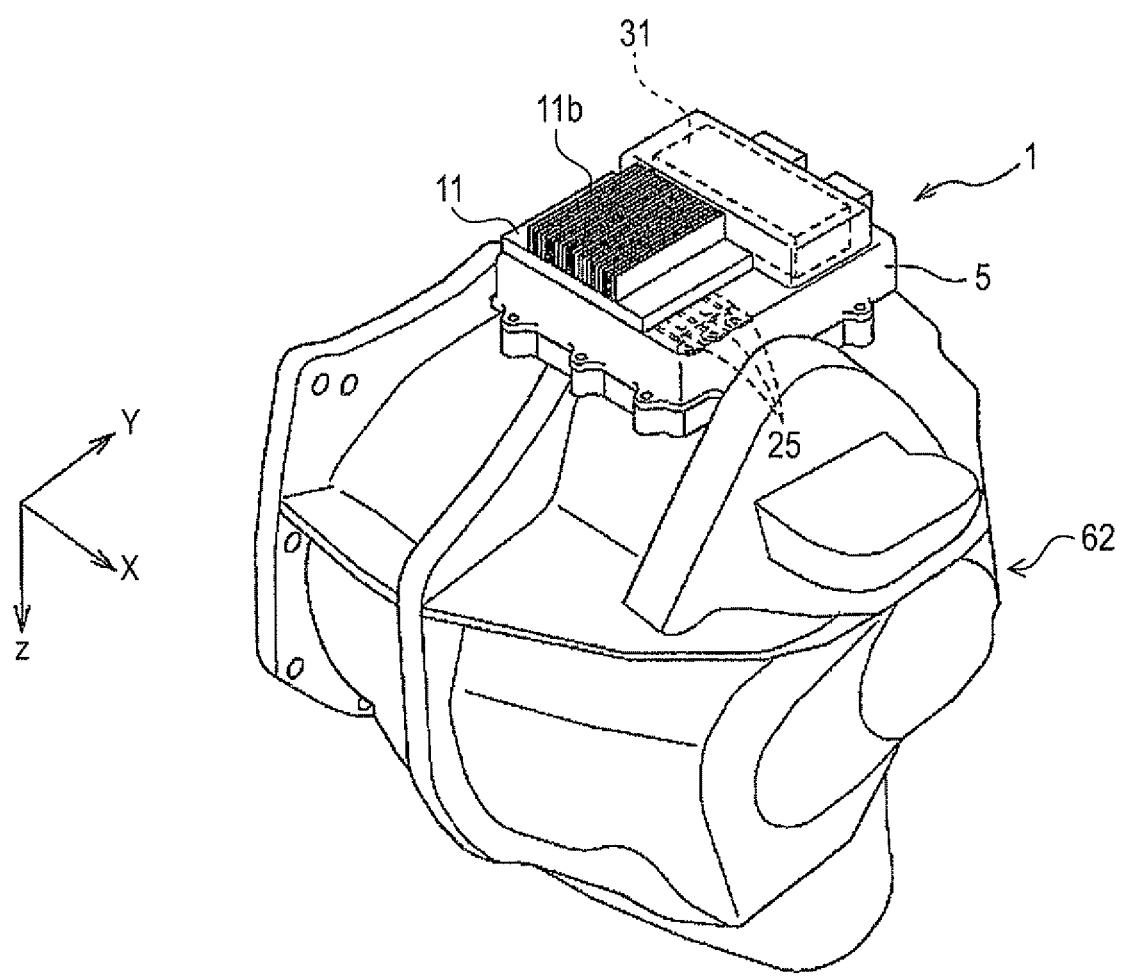
FIG. 1 is a perspective view of a vehicle drive device and an inverter device that are mounted on a vehicle.
Figure 8:
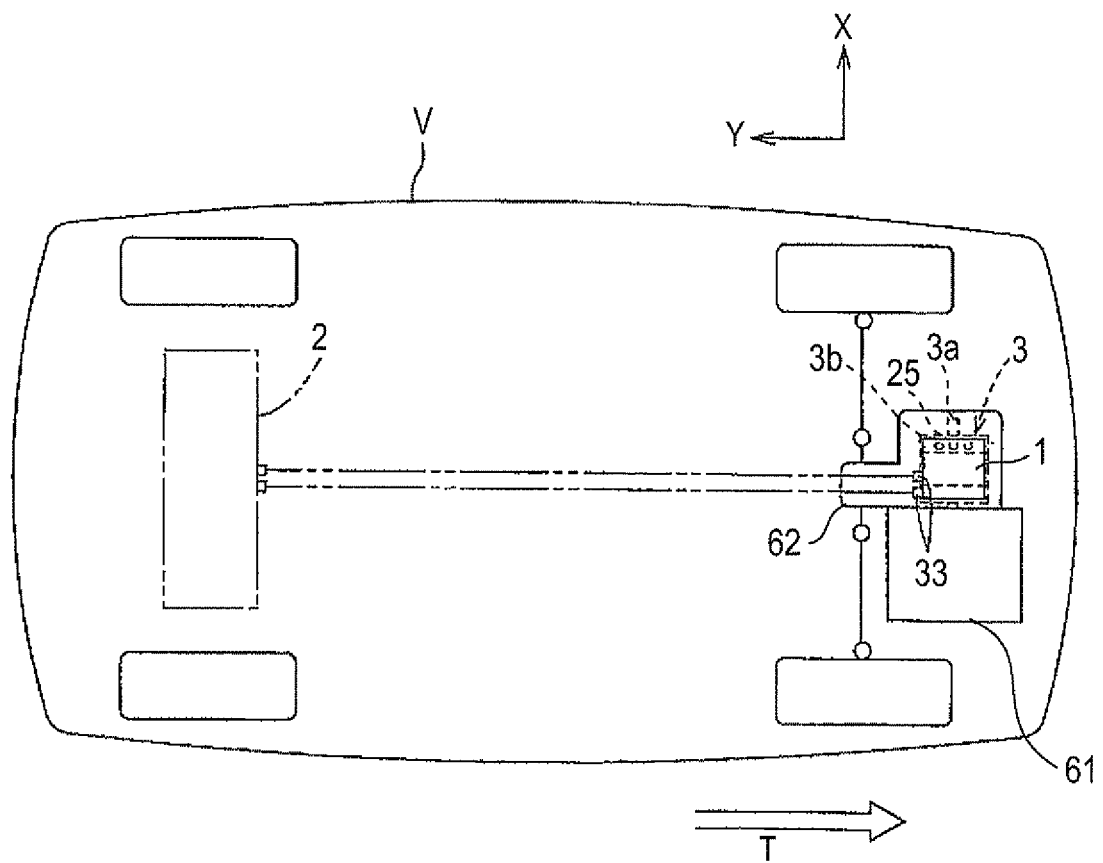
FIG. 8 is a schematic view showing a state where the vehicle drive device and the inverter device are mounted on a vehicle.

An embodiment of an inverter device according to the invention will be described with reference to the drawings. In this embodiment, an inverter device 1 of a system, which controls a rotary electric machine 3 functioning as a driving power source of for the wheels of a hybrid vehicle V (which may be simply referred to as a "vehicle V" hereinafter), will be described by way of example. As shown in FIG. 8, the hybrid vehicle V includes an internal combustion engine 61, a vehicle drive device 62 including a rotary electric machine 3, and an inverter device 1. The inverter device 1 includes an inverter circuit 7, and controls the rotary electric machine 3 that is an external device when seen from the inverter device 1. Meanwhile, in this embodiment, the rotary electric machine 3 is formed of an AC motor that is driven by three-phase alternating current. The rotary electric machine 3 can function as both a motor that is supplied with electric power and generates power and a generator that is supplied with power and generates electric power. A structure where the vehicle drive device 62 (here, a drive device case as a rotary electric machine case that receives the rotary electric machine 3) and the inverter device 1 are integrally fixed to each other as shown in FIG. 1 is employed in this embodiment.

Figure 2:
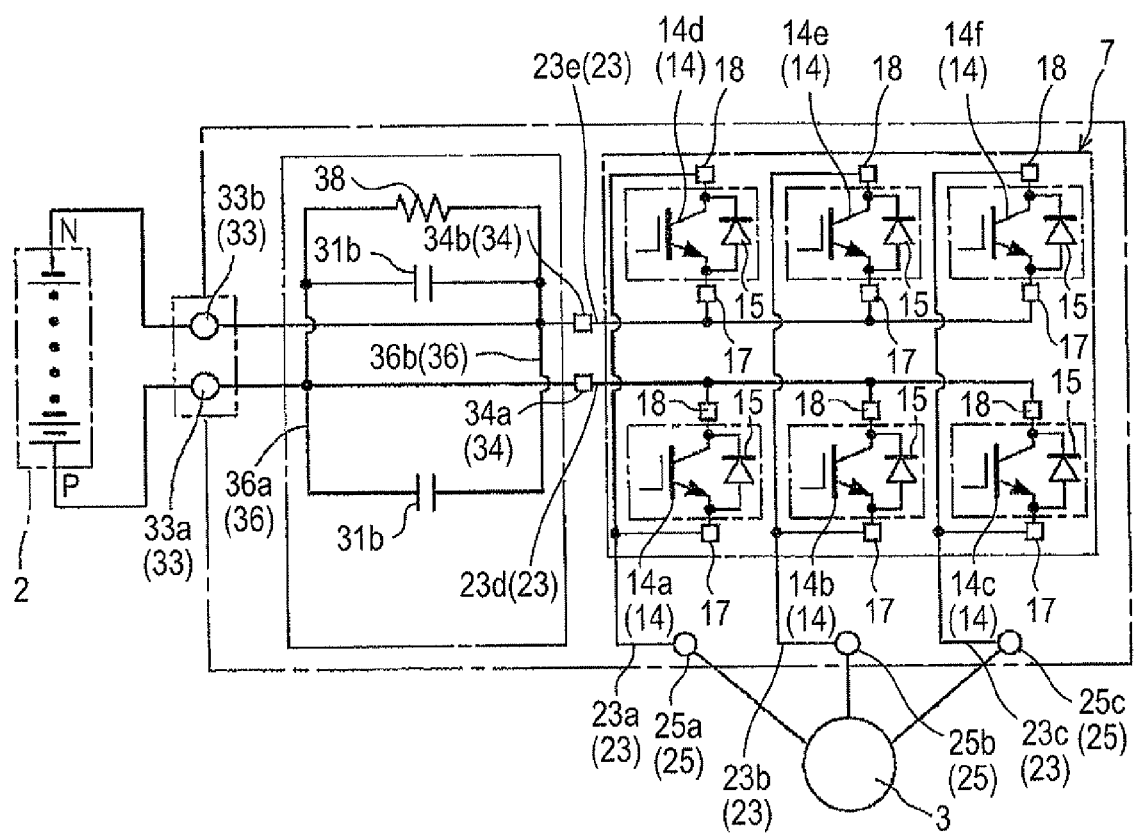
FIG. 2 is a schematic view showing the structure of an inverter circuit.

The inverter device 1 is connected to the rotary electric machine 3 as a driving power source of the vehicle V and a battery 2 as a DC power source that is an energy source of the rotary electric machine (see FIGS. 2 and 8). Further, the inverter device 1 includes a plurality of switching elements 14 that convert electric power between DC power and AC power, a base plate 11 that includes an element placing surface 11a on which the plurality of switching elements 14 are placed, rotary electric machine-connection terminals 25 that input and output AC power to and from the rotary electric machine 3, a capacitor 31 that is used to smooth DC power, power supply terminals 33 that input and output DC power to and from the battery 2, and a control board 41 that controls the operation of at least the switching elements 14. In this structure, the inverter device 1 according to this embodiment has characteristics in the configuration of the base plate 11, the rotary electric machine-connection terminals 25, and the capacitor 31. Further, the inverter device 1 according to this embodiment also has characteristics in the configuration of the respective components when being mounted on the vehicle V. The inverter device 1 according to this embodiment will be described in detail below.

Figure 4:
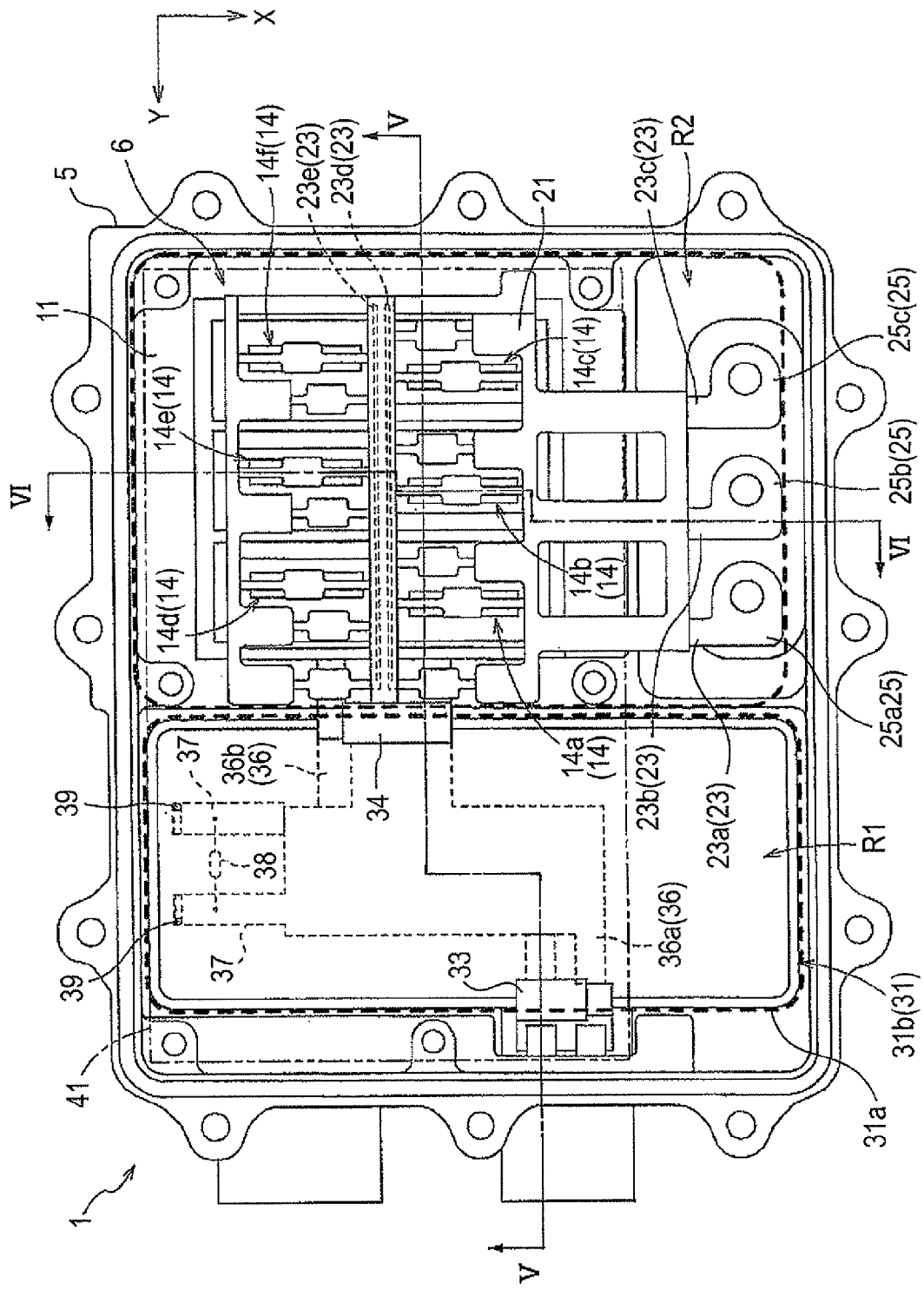
FIG. 4 is a plan view of the inverter device when seen in a Z direction.

Meanwhile, in this embodiment, the rotary electric machine-connection terminals 25 correspond to "AC terminals" of the invention. Further, in the following description, the respective directions, that is, an "X direction", a "Y direction", and a "Z direction" are defined on the basis of the element placing surface 11a except for the case where the directions are particularly specified and differentiated from each other. More specifically, directions, which are parallel to the element placing surface 11a and perpendicular to each other, are defined as the "X direction" and the "Y direction", respectively. In this embodiment, a vertical direction in FIG. 4 is the "X direction". Here, the side close to the rotary electric machine-connection terminals 25 relative to the base plate 11 (the lower side in FIG. 4) corresponds to "+X direction", and the side close to the base plate 11 relative to the rotary electric machine-connection terminals 25 (the upper side in FIG. 4) corresponds to "−X direction". Furthermore, a horizontal direction in FIG. 4 is the "Y direction". Here, the side close to the capacitor 31 relative to the base plate 11 and the rotary electric machine-connection terminals 25 (the left side in FIG. 4) corresponds to "+Y direction", and the side close to the base plate 11 and the rotary electric machine-connection terminals 25 relative to the capacitor 31 (the right side in FIG. 4) corresponds to "−Y direction".

Figure 5:
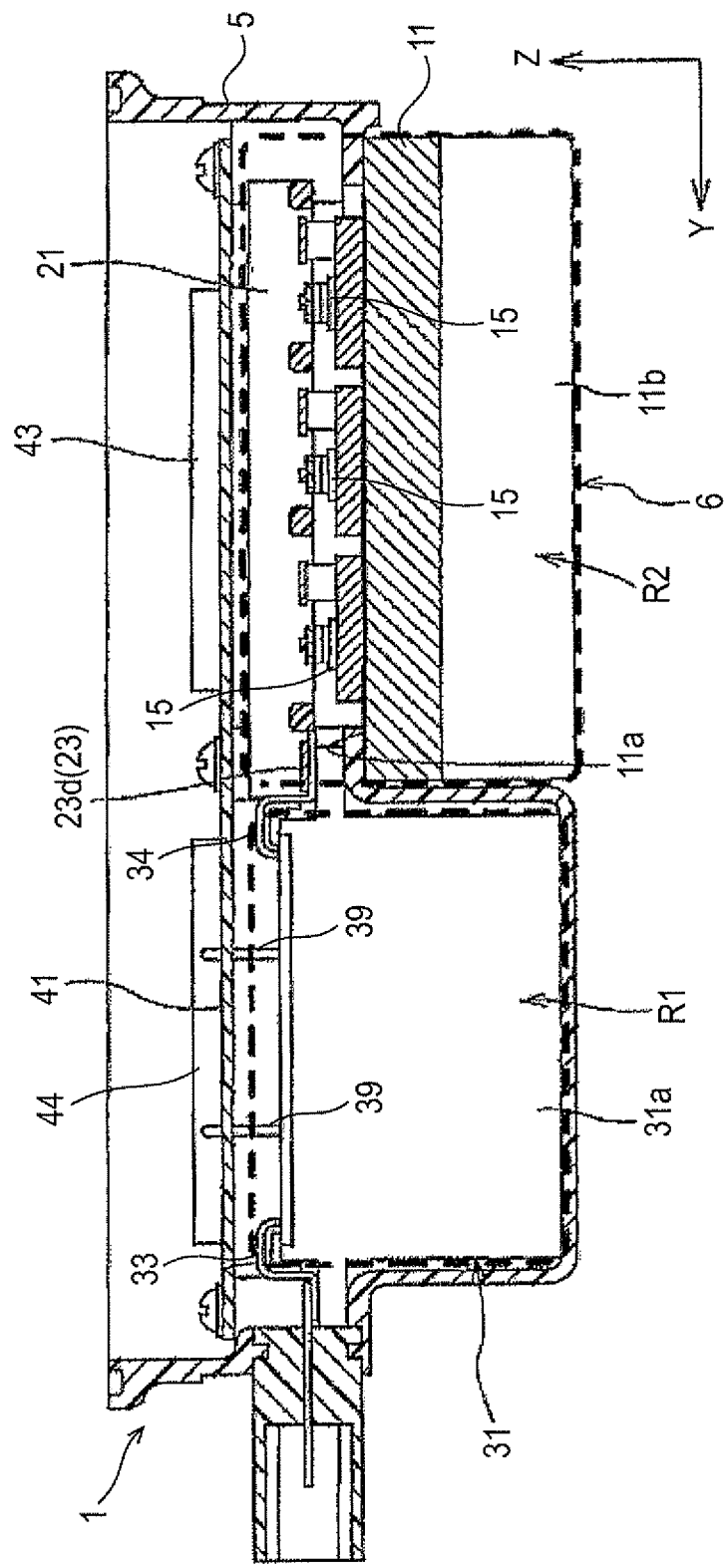
FIG. 5 is a side view of the inverter device when seen in an X direction.

Moreover, a direction perpendicular to the element placing surface 11a (a direction perpendicular to both the X direction and the Y direction) is defined as a "Z direction". In this embodiment, a vertical direction in FIG. 5 is the "Z direction". Here, the side close to the control board 41 relative to the base plate 11 and the capacitor 31 (the upper side in FIG. 5) corresponds to "+Z direction", and the side close to the base plate 11 and the capacitor 31 relative to the control board 41 (the lower side in FIG. 5) corresponds to "−Z direction". In this embodiment, the X direction, the Y direction, and the Z direction correspond to a "first reference direction", a "second reference direction", and a "perpendicular reference direction" of the invention, respectively.

1. Structure of Inverter Circuit

First, the structure of the inverter circuit 7 will be described. The inverter circuit 7 according to this embodiment includes a plurality of (six in this embodiment) switching elements 14. The switching elements 14 are electronic elements that convert electric power between DC power and AC power, and serve as the core of the inverter circuit 7 and the inverter device 1. As shown in FIG. 2, the inverter circuit 7 is formed of a bridge circuit, two switching elements 14 are connected in series between the side of a positive electrode P of the battery 2 and the side of a negative electrode N (for example, the ground side) of the battery 2, and three series circuits each of which is formed of two switching elements are connected in parallel. That is, the inverter circuit 7 has a three-leg structure including three legs that include the switching elements 14 forming upper stage arms connected to the side of the positive electrode P and the switching elements 14 forming lower stage arms connected to the side of the negative electrode N. The legs correspond to three phases (U phase, V phase, and W phase) of coils (stator coils) 3b (see FIG. 8) of the rotary electric machine 3, respectively.

In FIG. 2, reference numeral 14a denotes an upper stage-side switching element for a U phase, reference numeral 14b denotes an upper stage-side switching element for a V phase, and reference numeral 14c denotes an upper stage-side switching element for a W phase. Further, reference numeral 14d denotes a lower stage-side switching element for a U phase, reference numeral 14e denotes a lower stage-side switching element for a V phase, and reference numeral 14f denotes a lower stage-side switching element for a W phase. Here, the "upper stage-side" means an arm corresponding to the side of the positive electrode P, and the "lower stage-side" means an arm corresponding to the side of the negative electrode N.

Collectors of the upper stage-side switching elements 14a, 14b, and 14c for the respective phases are connected to the side of the positive electrode P through a fourth bus bar 23d, and emitters thereof are connected to collectors of the lower stage-side switching elements 14d, 14e, and 14f for the respective phases through bus bars 23a, 23b, and 23c. Moreover, emitters of the lower stage-side switching elements 14d, 14e, and 14f for the respective phases are connected to the side of the negative electrode N through a fifth bus bar 23e. A diode element 15 is connected in parallel between the emitter and the collector of each of the switching elements 14. An anode of the diode element 15 is connected to the emitter of each switching element 14, and a cathode thereof is connected to the collector of each switching element 14. The diode element 15 is used as an FWD (Free Wheel Diode).

The respective arms, which include the switching elements (14a and 14d), (14b and 14e), and (14c and 140 making a pair and the respective corresponding bus bars 23a, 23b, and 23c, are connected to the coils 3b (see FIG. 8) for the respective phases of the rotary electric machine 3 through the rotary electric machine-connection terminals 25a, 25b, and 25c. Further, gates of the respective switching elements 14 are connected to a drive circuit 43 (see FIG. 5) provided on a control board 41, and are individually subjected to switching control.

The inverter device 1, which includes the inverter circuit 7, converts DC power, which is supplied from the battery 2, into three-phase AC power and supplies the three-phase AC power to the rotary electric machine 3 by controlling the respective switching elements 14 (for example, performing the pulse width modulation control or the like of the respective switching elements) on the basis of required rotational speed and required torque that are required for the rotary electric machine 3. Accordingly, the power running of the rotary electric machine 3 is performed according to required rotational speed and required torque. Meanwhile, when the rotary electric machine 3 functions as a generator and is supplied with electric power from the side of the rotary electric machine 3, the inverter device 1 converts the generated three-phase AC power into DC power and charges the battery 2 by controlling the respective switching elements 14.

2. Entire Structure of Inverter Device

Next, the entire structure of the inverter device 1 will be described mainly with reference to FIGS. 3 and 4. The inverter device 1 includes an inverter module 6, a capacitor 31, and the control board 41. These are received in an inverter case 5 (hereinafter, simply referred to as a "case 5") that is formed in a rectangular parallelepiped shape. The inverter module 6 is a module on which the above-mentioned inverter circuit 7 is mounted, and is interposed between the battery 2 and the rotary electric machine 3. The capacitor 31 is further interposed between the battery 2 and the inverter module 6.

The inverter module 6 includes the base plate 11, the plurality of switching elements 14 that are provided on the base plate 11, and a connecting support 21 that supports the plurality of bus bars 23, as main components.

The base plate 11 is a plate-like member serving as a base on which the switching elements 14 are placed. The base plate 11 is made of a metal material such as copper or aluminum. As shown in FIG. 3 and the like, an insulating member 12 and element substrates 13 are stacked on the upper surface (the surface corresponding to +Z direction side; similarly hereinafter) of the base plate 11, that is, the surface (element placing surface 11a) of the base plate 11 on which the switching elements 14 are placed, so as to be parallel or substantially parallel to each other. This stacking direction corresponds with the Z direction.

The insulating member 12 is formed of a sheet-like member that has both electric insulation and thermal conductivity, and is formed of a sheet member made of a resin in this embodiment. The element substrates 13 are made of a conductive material (for example, a metal material such as copper or aluminum), and are fixedly bonded to the base plate 11 with the insulating member 12 interposed therebetween by thermocompression bonding. The element substrate 13 also functions as a heat spreader. As shown in FIG. 3, in this embodiment, one insulating member 12 is disposed on the base plate 11 and six element substrates 13 are disposed on the insulating member 12. These six element substrates 13 are disposed so as to be lined up in two lines in the X direction and lined up in three lines in the Y direction.

One switching element 14 and one diode element 15 are disposed on the upper surface of each of the element substrates 13. Accordingly, in this embodiment, six switching elements 14 and six diode elements 15 are provided on the element placing surface 11a of the base plate 11 with the insulating member 12 and the element substrates 13 interposed therebetween. Further, the inverter circuit 7 includes the switching elements 14 and the diode elements 15. In this embodiment, an IGBT (insulated gate bipolar transistor) is used as the switching element 14. Meanwhile, a MOSFET (metal oxide semiconductor field effect transistor) or the like may also be used as the switching element 14. Furthermore, in this embodiment, as shown in FIG. 3 or the like, the switching element 14 and the diode element 15, which are placed on the same element substrate 13, are disposed adjacent to each other so as to be lined up in the X direction.

A first electrode member 17 is disposed while electrically connecting the upper surface (emitter electrode) of the switching element 14 to the upper surface (anode electrode) of the diode element 15. In this embodiment, the first electrode member 17 is formed by bending a belt-like member (plate-like member) that has a constant width. Further, a second electrode member 18 is placed on the upper surface of each of the element substrates 13. The second electrode member 18 electrically connects the lower surface (collector electrode) of the switching element 14 to the lower surface (cathode electrode) of the diode element 15 through the element substrate 13. The second electrode member 18 is formed of a block-like member in this embodiment. Both the first and second electrode members 17 and 18 are made of a conductive material (for example, a metal material such as copper or aluminum).

In this embodiment, the switching elements (14a and 14d), (14b and 14e), and (14c and 14f) making a pair, the respective corresponding diode elements 15, the respective corresponding first electrode members 17, the respective corresponding second electrode members 18, and the respective corresponding bus bars 23a, 23b, and 23c (hereinafter, these may be simply referred to as the "diode elements 15, and the like") form the respective legs of the inverter circuit 7. Among these, the switching elements 14a, 14b, and 14c, the respective corresponding diode elements 15, and the like form the respective upper stage arms of the inverter circuit 7. Further, the switching elements 14d, 14e, and 14f, the respective corresponding diode elements 15, and the like form the respective lower stage arms of the inverter circuit 7.

Figure 3:
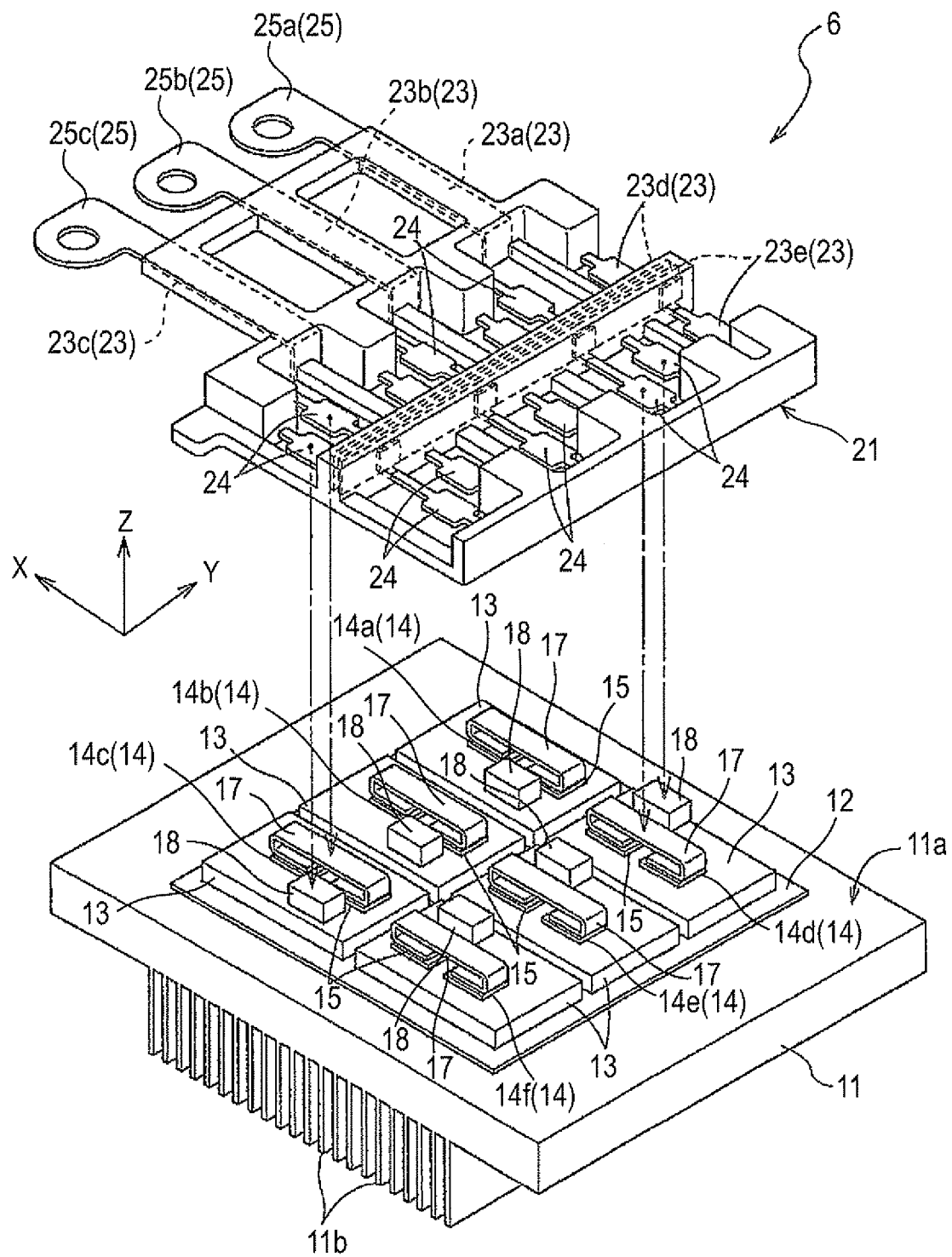
FIG. 3 is an exploded perspective view of an inverter module.

Furthermore, in this embodiment, as shown in FIGS. 3 and 4, the direction in which the upper and lower stage arms of each leg are connected to each other is set to a direction along the X direction. In this embodiment, as being capable of being understood from FIG. 4, the ranges, which are occupied by the upper and lower stage arms of the respective legs in the Y direction, are slightly deviated from each other without exactly corresponding with each other. However, these upper and lower stage arms occupy substantially the same range in the Y direction, and a direction in which the upper and lower stage arms are connected to each other is substantially along the X direction. Accordingly, the "direction along the X direction" of this embodiment represents a direction parallel to the X direction or a direction that is inclined with respect to the X direction by a predetermined angle. In this case, the predetermined angle may be in the range of, for example, ±20°, preferably, in the range of ±10°. Since the direction in which the upper and lower stage arms of each leg are connected to each other is set to the direction along the X direction as described above, it is possible to simplify the shapes of the portions of the bus bars 23a, 23b, and 23c, which are toward the rotary electric machine-connection terminals 25a, 25b, and 25c, into the shape close to the shape of a straight line along the X direction. Further, since it is possible to make the shapes of the bus bars 23a, 23b, and 23c be the same as each other or substantially same as each other, it is possible to simplify the disposition of each of the bus bars 23a, 23b, and 23c.

Furthermore, in this embodiment, the diode element 15 and the switching element 14 forming each arm are disposed adjacent to each other in the X direction. Moreover, the belt-like first electrode member 17, which connects the switching element 14 to the diode element 15, is also disposed so as to extend in the X direction accordingly. As described above, each of the arms is formed so as to extend in the X direction as a whole. In other words, the upper and lower stage arms of each legs are disposed so that the longitudinal direction of each of the upper and lower stage arms is the direction along the X direction. Accordingly, it is possible to reduce the lengths of the bus bars 23d and 23e in the Y direction as compared to the case where the upper and lower stage arms are disposed so that the longitudinal direction of each of the upper and lower stage arms is the direction along the Y direction. Therefore, it is possible to reduce the electrical resistance of the bus bars 23d and 23e serving as the transmission path for DC power, so that it is possible to improve energy efficiency.

Further, in this embodiment, three legs are sequentially arrayed in the Y direction. In this embodiment, the ranges, which are occupied in the X direction by the upper stage arms forming the respective legs, exactly correspond with each other. Likewise, the ranges, which are occupied in the X direction by the lower stage arms forming the respective legs, exactly correspond with each other. Accordingly, in this embodiment, three legs are sequentially arrayed in the direction parallel to the Y direction. Therefore, it is possible to simplify the shapes of portions of the bus bars 23d and 23e, which connect the respective legs, into the shape close to the shape of a straight line along the Y direction. Furthermore, since it is possible to make the shapes of the bus bars 23d and 23e be the same as each other or substantially the same as each other, it is possible to simplify the disposition of each of the bus bars 23d and 23e.

Figure 6:
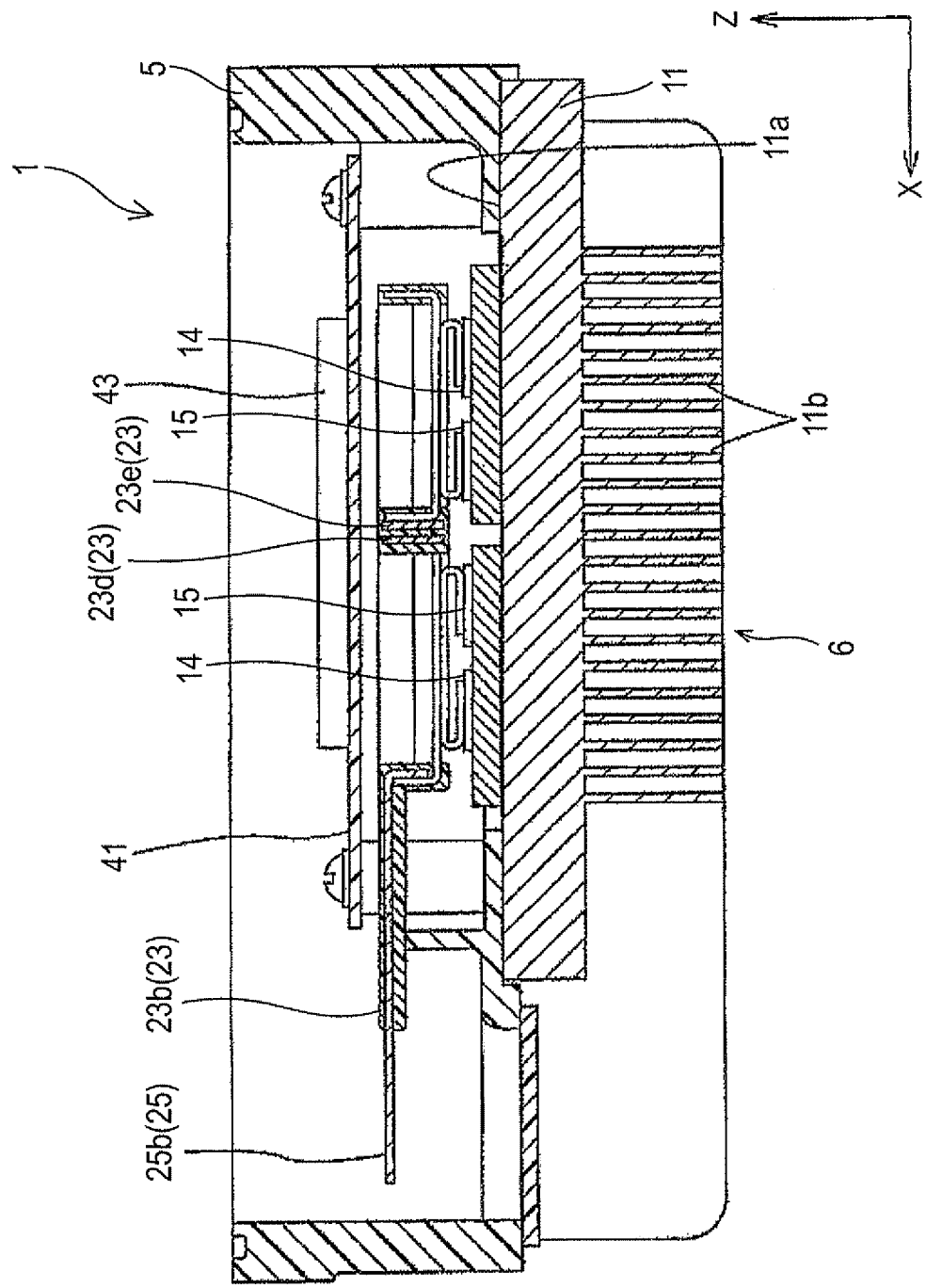
FIG. 6 is a side view of the inverter device when seen in a Y direction.

As shown in FIG. 3, heat dissipating fins 11b are provided on the side of the base plate 11 opposite to the element placing surface 11a. In this embodiment, the heat dissipating fins 11b are formed integrally with the base plate 11. The heat dissipating fins 11b dissipate the heat of the switching elements 14 (heat generated due to a switching operation), which is transferred to the base plate 11 through the element substrates 13 and the insulating member 12, from the surface thereof. As shown in FIGS. 3 and 6 and the like, in this embodiment, the heat dissipating fins 11b are formed so as to be erected in the Z direction and extend in the shape of a flat plate in the direction parallel to the Y direction.

The connecting support 21 is a structure that supports the plurality of bus bars 23, and is provided on the side of the element placing surface 11a of the base plate 11 so as to be fixed to the base plate 11. Five bus bars 23, that is, a first bus bar 23a, a second bus bar 23b, a third bus bar 23e, a fourth bus bar 23d, and a fifth bus bar 23e are provided as the bus bars 23 in this embodiment. These five bus bars 23 are integrally supported by the connecting support 21. The bus bar 23 is made of a conductive material (for example, a metal material such as copper or aluminum), and is formed by bending a flat plate-like member in a predetermined shape in this embodiment.

The first bus bar 23a, the second bus bar 23b, and the third bus bar 23c are electrical connection members that electrically connect the switching elements 14 and the diode elements 15 of the upper stage arms to the rotary electric machine-connection terminals 25 through the first electrode members 17, respectively, and electrically connect the switching elements 14 and the diode elements 15 of the lower stage arms to the rotary electric machine-connection terminals 25 through the second electrode members 18, respectively. The bus bars 23a, 23b, and 23c extend in a direction along the X direction as a whole so as to be parallel to the direction in which the upper and lower stage arms of each leg are connected to each other. The fourth bus bar 23d is an electrical connection member that electrically connects the diode elements 15 and the switching elements 14 of the upper stage arms to a positive electrode-side DC terminal 34a, that is, a DC terminal 34 corresponding to the positive electrode P through the second electrode members 18. The fifth bus bar 23e is an electrical connection member that electrically connects the diode elements 15 and the switching elements 14 of the lower stage arms to a negative electrode-side DC terminal 34b, that is, a DC terminal 34 corresponding to the negative electrode N through the first electrode members 17. The bus bars 23d and 23e extend in a direction along the Y direction as a whole so as to be parallel to each other between a set of three upper stage arms and a set of three lower stage arms.

In this embodiment, a plurality of joint portions 24, which are supported by the connecting support 21 formed integrally with the respective bus bars 23, are joined to the upper surfaces of the first and second electrode members 17 and 18 so as to be pressed against the upper surfaces of the first and second electrode members 17 and 18, so that the electrical connection between the respective bus bars 23 and the first and second electrode members 17 and 18 is achieved. In the embodiment, the respective bus bars 23 are joined to the first and second electrode members 17 and 18 by laser welding that uses a YAG laser, a $CO_2$ laser, a semiconductor laser, or the like.

The rotary electric machine-connection terminals 25 are terminals that input and output AC power to and from the rotary electric machine 3 as a driving power source of the vehicle V. In this embodiment, the rotary electric machine-connection terminals 25a, 25b, and 25c for three phases are provided as the rotary electric machine-connection terminals 25. In this embodiment, the rotary electric machine-connection terminal 25a for a U phase is formed integrally with the first bus bar 23a at the end portion of the first bus bar 23a corresponding to +X direction side. Likewise, the rotary electric machine-connection terminal 25b for a V phase is formed integrally with the second bus bar 23b at the end portion of the second bus bar 23b corresponding to +X direction side, and the rotary electric machine-connection terminal 25c for a W phase is formed integrally with the third bus bar 23c at the end portion of the third bus bar 23c corresponding to +X direction side. These three rotary electric machine-connection terminals 25a, 25b, and 25c are sequentially arrayed in the direction parallel to the Y direction in accordance with the array of the three legs forming the inverter circuit 7. Meanwhile, in this embodiment, as described below, the Y direction corresponds with a direction that is perpendicular to a rotating shaft 3a of the rotary electric machine 3. Accordingly, the three rotary electric machine-connection terminals 25a, 25b, and 25c are sequentially arrayed in a direction perpendicular to the rotating shaft 3a. In this embodiment, the rotary electric machine-connection terminals 25a, 25b, and 25c for the respective phases correspond to "AC phase-terminals" of the invention.

The capacitor 31 is provided in parallel between the battery 2 and the inverter module 6, and smoothes DC power between the battery 2 and the inverter module 6. The capacitor 31 includes a case portion 31a and a capacitor element 31b. The case portion 31a is formed in the shape of a bathtub that is formed so as to cover both sides in the X direction, both sides in the Y direction, and one side in the Z direction and has a rectangular shape when seen in the Z direction (in plan view seen in the Z direction; hereinafter similarly, even in the views when seen in the respective directions). Power supply terminals 33 that input and output DC power to and from the battery 2 and DC terminals 34 that input and output DC power to and from the switching elements 14 are formed integrally with the case portion 31a. The power supply terminals 33 and the DC terminals 34 are electrically connected to each other by capacitor bus bars 36. The capacitor bus bars 36 are made of a conductive material (for example, a metal material such as copper or aluminum), and are formed in the shape of a flat plate in this embodiment. Two capacitor bus bars 36, that is, first and second capacitor bus bars 36a and 36b are provided as the capacitor bus bars 36 in this embodiment. In this embodiment, the capacitor bus bars 36a and 36b correspond to "capacitor connecting members" of the invention.

The first capacitor bus bar 36a electrically connects a positive electrode-side power supply terminal 33a, which is a power supply terminal 33 corresponding to the positive electrode P, to the positive electrode-side DC terminal 34a (see FIG. 2). The second capacitor bus bar 36b electrically connects a negative electrode-side power supply terminal 33b, which is a power supply terminal 33 corresponding to the negative electrode N, to the negative electrode-side DC terminal 34b. As shown in FIG. 4, the first and second capacitor bus bars 36a and 36b are disposed at positions that overlap each other when seen in the Z direction. Further, in the case portion 31a formed in the shape of a bathtub, a terminal of one electrode of the capacitor element 31b is connected to the first capacitor bus bar 36a and a terminal of the other electrode of the capacitor element 31b is connected to the second capacitor bus bar 36b.

Each of the first and second capacitor bus bars 36a and 36b is formed in a rectangular shape as a whole when seen in the Z direction. Furthermore, the first and second capacitor bus bars 36a and 36b include protruding portions 37 that protrude in −X direction and have a rectangular shape when seen in the Z direction. The two protruding portions 37 are formed at the end portions of the capacitor bus bars 36a and 36b corresponding to −X direction side at positions that are different from each other in the Y direction. A resistor 38 is connected between these two protruding portions 37. The resistor 38, which is connected in parallel to the capacitor element 31b, functions as a discharge resistor that discharges charges accumulated in the capacitor element 31b when the supply of electric power from the battery 2 is stopped.

Branch connection portions 39, which are branched from the protruding portions 37 and extend toward +Z direction side in the Z direction, are formed at the end portions of the protruding portions 37 of the first and second capacitor bus bars 36a and 36b, which correspond to −X direction side, respectively. The branch connection portions 39 are made of a conductive material (for example, a metal material such as copper or aluminum), and are formed in a linear shape (the shape of a wire) in this embodiment. The capacitor element 31b, the first and second capacitor bus bars 36a and 36b, the resistor 38, and a part of the branch connection portions 39 corresponding to −Z direction side are molded with a resin while being disposed in the case portion 31a. Meanwhile, an epoxy resin, an acrylic resin, a urethane resin, and the like may be used as a mold resin. A part of the branch connection portions 39 corresponding to +Z direction side are exposed from the resin and extend in the Z direction.

The control board 41 mainly has a function of controlling the operations of the respective switching elements 14. For this reason, the control board 41 is provided with a drive circuit 43 that individually controls the switching of at least the switching elements 14 (see FIG. 5). Further, in this embodiment, the control board 41 is also provided with a voltage detecting circuit 44 that detects the voltage between both electrodes of the capacitor 31. Furthermore, the control board 41 is also provided with a current detecting circuit that detects alternating current flowing through the bus bars 23a, 23b, and 23e; a temperature detecting circuit that detects the temperatures of the switching elements 14; and the like. In this embodiment, the control board 41 is disposed on the upper side of the inverter module 6 and the capacitor 31 (+Z direction side) so as to be close to the inverter module 6 and the capacitor 31.

3. Configuration of Respective Components of Inverter Device

Next, the configuration of the respective components of the inverter device 1 will be described mainly with reference to FIGS. 4 to 7. Here, the configuration seen in the Z direction, the configuration seen in the X direction, and the configuration between two terminals 33 and 34 will be sequentially described.

3-1. Configuration Seen in Z Direction

In this embodiment, the connecting support 21, which support the plurality of (five in this embodiment) bus bars 23, is provided so as to be fixed to the base plate 11. Here, among the five bus bars 23, the bus bars 23a, 23b, and 23c extend in the direction along the X direction as a whole. The bus bars 23d and 23e extend in the direction along the Y direction as a whole between the upper and lower arms, here, at the position of the center 11c of gravity (see FIG. 7) of the base plate 11 in the X direction (the disposition position in the X direction; similarly hereinafter) when seen in the Z direction. The bus bars 23a, 23b, and 23c are perpendicular to the bus bars 23d and 23e when seen in the Z direction, respectively.

The bus bars 23a, 23b, and 23c are formed so that the length of each of the portions of the bus bars 23a, 23b, and 23c in the X direction on +X direction side of the bus bars 23d and 23e (the length in the X direction; similarly hereinafter) is longer than that of each of the portions of the bus bars 23a, 23b, and 23c in the X direction on −X direction side of the bus bars 23d and 23e. For this reason, each of the bus bars 23a, 23b, and 23c is disposed so as to protrude from the base plate 11 in the X direction. In this embodiment, the bus bars 23a, 23b, and 23c are disposed so as to protrude from the base plate 11 toward +X direction side. Meanwhile, the end portions of the bus bars 23a, 23b, and 23c corresponding to −X direction side are disposed at the positions that overlap the base plate 11 when seen in the Z direction.

Further, the rotary electric machine-connection terminals 25 (25a, 25b, and 25c) for the respective phases are formed at the end portions of the bus bars 23a, 23b, and 23c corresponding to +X direction side, respectively. Accordingly, in this embodiment, the rotary electric machine-connection terminals 25 for the respective phases are disposed so as to protrude from the base plate 11 toward +X direction side. Furthermore, the rotary electric machine-connection terminals 25 are disposed so as to also protrude from the connecting support 21 toward +X direction side. In this case, the rotary electric machine-connection terminals 25a, 25b, and 25c for the respective phases are disposed so that the end portions of the rotary electric machine-connection terminals corresponding to +X direction side are aligned with each other. In this embodiment, a "base disposition area R2" is defined as an area in which the base plate 11, the connecting support 21, the bus bars 23a, 23b, and 23c, and the rotary electric machine-connection terminals 25 are disposed. As shown in FIG. 4, the base disposition area R2 is a rectangular area that occupies an area from the end portion of the base plate 11 corresponding to −X direction side to the end portions of the rotary electric machine-connection terminals 25 corresponding to +X direction side and occupies an area from the end portion of the base plate 11 corresponding to −Y direction side to the end portion of the connecting support 21 corresponding to +Y direction side, when seen in the Z direction. Moreover, in this embodiment, the base disposition area R2 is set so that long sides of the rectangular shape are parallel to the X direction when seen in the Z direction.

Further, in this embodiment, a "capacitor disposition area R1" is defined as an area in which the capacitor 31, and the power supply terminals 33, the DC terminals 34, and the capacitor bus bars 36 attached to the capacitor 31 are disposed. In this embodiment, all of the power supply terminals 33, the DC terminals 34, and the capacitor bus bars 36 are formed integrally with the case portion 31a of the capacitor 31 or are disposed in the case portion 31a. Accordingly, the capacitor disposition area R1 is set to a rectangular area corresponding to the shape of the case portion 31a when seen in the Z direction. Furthermore, in this embodiment, the capacitor disposition area R1 is set so that long sides of the rectangular shape are parallel to the X direction when seen in the Z direction.

As shown in FIG. 4, the capacitor disposition area R1 and the base disposition area R2 are disposed adjacent to each other in the Y direction. Here, the capacitor disposition area R1 is set adjacent to the base disposition area R2 on +Y direction side. In this case, the length of the capacitor disposition area R1 in the X direction is set so as to be longer than the length of the base plate 11 in the X direction. In this embodiment, the position of the end portion of the case portion 31a, which corresponds to −X direction side and defines the end portion of the capacitor disposition area R1 corresponding to −X direction side, in the X direction and the position of the end portion of the base plate 11, which corresponds to −X direction side, in the X direction are slightly deviated from each other without exactly corresponding with each other. However, these positions are substantially the same as each other. Meanwhile, the end portion of the case portion 31a, which corresponds to +X direction side and defines the end portion of the capacitor disposition area R1 corresponding to +X direction side, is positioned at a position that is deviated from the end portion of the base plate 11, which corresponds to +X direction side, toward +X direction side.

In this configuration, an area, which does not overlap the base plate 11 and overlaps the capacitor disposition area R1 when seen in the Y direction, is formed at the position adjacent to the base plate 11 on +X direction side due to the difference between the length of the capacitor disposition area R1 and the length of the base plate 11 in the X direction.

In this embodiment, the rotary electric machine-connection terminals 25 are disposed so that the entire rotary electric machine-connection terminals are received in the area formed in this way, that is, the area between the end portion of the base plate 11 corresponding to +X direction side and the end portion of the case portion 31a corresponding to +X direction side in the X direction.

Furthermore, in this embodiment, the length and position of the capacitor disposition area R1 in the X direction are set so as to correspond with the length and position of the base disposition area R2 in the X direction. Here, both the length and position of the capacitor disposition area R1 in the X direction are set so as to correspond with both the length and position of the base disposition area R2 in the X direction.

In this embodiment, the position of the end portion of the base plate 11, which corresponds to −X direction side and defines the end portion of the base disposition area R2 corresponding to −X direction side, in the X direction and the position of the end portion of the case portion 31a, which corresponds to −X direction side and defines the end portion of the capacitor disposition area R1 corresponding to −X direction side, in the X direction are slightly deviated from each other without exactly corresponding with each other. However, these positions are substantially the same as each other. Likewise, the positions of the end portions of the rotary electric machine-connection terminals 25, which correspond to +X direction side and define the end portion of the base disposition area R2 corresponding to +X direction side, in the X direction and the position of the end portion of the case portion 31a, which corresponds to +X direction side and defines the end portion of the capacitor disposition area R1 corresponding to +X direction side, in the X direction are slightly deviated from each other without exactly corresponding with each other. However, these positions are substantially the same as each other. Accordingly, in this embodiment, the positions of both end portions of the capacitor disposition area R1 in the X direction are set so as to be substantially the same as the positions of both end portions of the base disposition area R2 in the X direction, respectively. Naturally, the length of the capacitor disposition area R1 in the X direction is substantially equal to the length of the base disposition area R2 in the X direction.

As described above, "correspond" of this embodiment means that events, that is, objects to be compared (here, the events include the position in the X direction and the length in the X direction) are substantially the same as each other. That is, "correspond" includes not only a state where events, that is, objects to be compared are exactly the same as each other but also a state where there are differences between these events. For example, "correspond" also includes a state where differences between the events, that is, the objects to be compared are sufficiently small as compared to all of the events and the events are substantially the same as each other so that peripheral portions can be designed or manufactured, or a state where there are differences caused by allowable errors in design or manufacture. An "allowable difference" in this case may be within ±10%, preferably, within ±5%, and more preferably, within ±3% on the basis (100%) of, for example, the length of each of the areas R1 and R2 in the X direction.

Meanwhile, the capacitor 31 has a relatively large degree of freedom in the design of the size and shape thereof, as compared to the rotary electric machine-connection terminals 25 that input and output AC power to and from the rotary electric machine 3 or the base plate 11 on which the switching elements 14 are provided. For this reason, it is relatively easy to adjust the size and shape of the capacitor 31 in accordance with the size and shape of the capacitor disposition area R1. In consideration of this, in this embodiment, the length and position of the capacitor disposition area R1 in the X direction are set so as to correspond with the length and position of the base disposition area R2 in the X direction. Accordingly, in terms of a positional relationship in the direction along the X direction, the capacitor 31 can be disposed so as to be received in the area that is occupied by all of the base plate 11 and the rotary electric machine-connection terminals 25. Therefore, all of the base plate 11, the rotary electric machine-connection terminals 25, and the capacitor 31 can be disposed so as to be compactly received in the case 5, which has a rectangular shape when seen in the Z direction, without dead spaces. As a result, it is possible to reduce the size of the inverter device 1.

Further, in this embodiment, as shown in FIG. 4, the control board 41 is disposed so that the end portion of the control board corresponding to −X direction side is aligned with both the capacitor disposition area R1 and the base disposition area R2 of which the end portions corresponding to −X direction side substantially correspond with each other. Accordingly, in this embodiment, the positions of the end portions of the capacitor disposition area R1, the base disposition area R2, and the control board 41, which correspond to −X direction side when seen in the Z direction, in the X direction are substantially the same as each other. Furthermore, the control board 41 is disposed so that the end portion of the control board corresponding to +X direction side is aligned with the end portion of the base plate 11 corresponding to +X direction side. Accordingly, in this embodiment, the positions of the end portions of the base plate 11 and the control board 41, which correspond to +X direction side when seen in the Z direction, in the X direction are substantially the same as each other. Therefore, the control board 41, which is formed in a rectangular shape in accordance with the shape of the case 5, is disposed at a position that overlaps both the capacitor disposition area R1 and the base disposition area R2 when seen in the Z direction. More specifically, the control board 41 is disposed at a position that partially overlaps a part of the capacitor disposition area R1 corresponding to −X direction side and overlaps all of the area of the base disposition area R2 in which the base plate 11 is disposed, when seen in the Z direction.

Meanwhile, the control board 41 is disposed at a position that does not overlap the rotary electric machine-connection terminals 25 (a position different from the positions of the rotary electric machine-connection terminals 25) when seen in the Z direction. Accordingly, it is possible to allow the rotary electric machine-connection terminals 25 to be electrically connected to the coils 3b of the rotary electric machine 3 without interference with the control board 41, while all of the main components, which also include the control board 41, of the inverter device 1 are received in the case 5 that has a rectangular shape when seen in the Z direction.

3-2. Configuration Seen in X Direction

In this embodiment, the base plate 11 includes the heat dissipating fins 11b that are erected in the Z direction and provided on the surface of the base plate 11 opposite to the element placing surface 11a (see FIGS. 3 and 5, and the like). For this reason, a disposition area for the heat dissipating fins 11b is also included in the "base disposition area R2" that is defined as the area in which the base plate 11, the connecting support 21, the bus bars 23a, 23b, and 23c, and the rotary electric machine-connection terminals 25 are disposed. In this case, as shown in FIG. 5, the base disposition area R2 is a rectangular area that occupies an area from tip portions of the heat dissipating fins 11b (the end portions of the heat dissipating fins corresponding to −Z direction side) to the end portion of the connecting support 21 corresponding to +Z direction side and occupies an area from the end portion of the base plate 11 corresponding to −Y direction side to the end portion of the connecting support 21 corresponding to +Y direction side, when seen in the X direction. Meanwhile, the capacitor disposition area R1 is set to a rectangular area corresponding to the shape of the case portion 31*a* even when seen in the X direction.

In this case, as shown in FIG. 5, the length and position of the capacitor disposition area R1 in the Z direction are set so as to correspond with the length and position of the base disposition area R2 in the Z direction. Here, both the length and position of the capacitor disposition area R1 in the Z direction are set so as to correspond with both the length and position of the base disposition area R2 in the Z direction.

In this embodiment, the positions of the tip portions of the heat dissipating fins 11*b* (the end portions of the heat dissipating fins corresponding to −Z direction side), which define the end portion of the base disposition area R2 corresponding to −Z direction side, in the Z direction and the position of the bottom of the case portion 31*a* (the end portion of the case portion corresponding to −Z direction side), which defines the end portion of the capacitor disposition area R1 corresponding to −Z direction side, in the Z direction are slightly deviated from each other without exactly corresponding with each other. However, these positions are substantially the same as each other. Likewise, the position of the end portion of the connecting support 21 corresponding to +Z direction side, which defines the end portion of the base disposition area R2 corresponding to +Z direction side, in the Z direction and the position of the end portion of the mold resin corresponding to +Z direction side (not shown), which defines the end portion of the capacitor disposition area R1 corresponding to +Z direction side, in the Z direction are slightly deviated from each other without exactly corresponding with each other. However, these positions are substantially the same as each other. Accordingly, in this embodiment, the positions of both end portions of the capacitor disposition area R1 in the Z direction are set so as to be substantially the same as the positions of both end portions of the base disposition area R2 in the Z direction, respectively. Naturally, the length of the capacitor disposition area R1 in the Z direction is substantially equal to the length of the base disposition area R2 in the Z direction.

As described above, in this embodiment, the length and position of the capacitor disposition area R1 in the Z direction are set so as to correspond with the length and position of the base disposition area R2 in the Z direction. Accordingly, in terms of a positional relationship in the direction along the Z direction, the capacitor 31 can be disposed so as to be received in the area that is occupied by all of the base plate 11 including the heat dissipating fins 11*b*, the rotary electric machine-connection terminals 25, and the connecting support 21. Therefore, all of the base plate 11 including the heat dissipating fins 11*b*, the rotary electric machine-connection terminals 25, the connecting support 21, and the capacitor 31 can be disposed so as to be compactly received in the case 5, which has a rectangular shape when seen in the X direction, without dead spaces.

As described above, in this embodiment, the length and position of the capacitor disposition area R1 are set so as to correspond with the length and position of the base disposition area R2 in both the X direction and the Z direction. For this reason, all of the main components of the inverter device 1 can be compactly received in the case 5, which has a rectangular parallelepiped shape, without dead spaces. Accordingly, it is possible to reduce the size of the inverter device 1.

There are many cases where there is a limitation on the mounting of the inverter device on the vehicle V in the use for the control of the rotary electric machine 3 provided in the hybrid vehicle V as in this embodiment. For this reason, the structure of the inverter device 1 of which the size can be reduced as much as possible as described above has a significant merit particularly in the above-mentioned use.

Moreover, in this embodiment, as shown in FIG. 5, the control board 41 is disposed adjacent to both the capacitor disposition area R1 and the base disposition area R2, of which the end portions corresponding to +Z direction side substantially correspond with each other, in the +Z direction. Accordingly, the increase of the size of the inverter device 1 in the Z direction is suppressed. In this case, in this embodiment, the drive circuit 43 provided on the control board 41 is disposed adjacent to the base disposition area R2 in the +Z direction and the voltage detecting circuit 44 provided on the control board 41 is disposed adjacent to the capacitor disposition area R1 in the +Z direction. Further, while passing through the control board 41, the branch connection portions 39, which are formed at the protruding portions 37 of the capacitor bus bars 36*a* and 36*b* and extend toward +Z direction side in the shape of a straight line along the Z direction, are connected to the voltage detecting circuit 44 that is provided adjacent to the capacitor disposition area R1 in the +Z direction. Accordingly, it is possible to connect two capacitor bus bars 36*a* and 36*b*, which are connected to both electrodes of the capacitor 31, to the voltage detecting circuit 44 at the shortest distance.

3-3. Configuration of Power Supply Terminals and DC Terminals

Next, the configuration of the power supply terminals 33 and the DC terminals 34 will be described mainly with reference to FIG. 7. In this embodiment, as described above, the rotary electric machine-connection terminals 25 for the respective phases are disposed so as to protrude from the base plate 11 toward +X direction side and the length and position of the capacitor disposition area R1 in the X direction are set so as to correspond with the length and position of the base disposition area R2 in the X direction. For this reason, when the lengths of the base plate 11 and the capacitor 31 (the capacitor disposition area R1) in the X direction are compared with each other, the length of the capacitor 31 in the X direction is longer. Accordingly, the position of the center 11*e* of gravity of the base plate 11 in the X direction when seen in the Z direction (the center of gravity of the planar shape of the base plate when seen in the Z direction; similarly hereinafter) is different from the position of the center 31*c* of gravity of the capacitor 31 (which is regarded to substantially correspond with the center of gravity of the capacitor disposition area R1) in the X direction. In this embodiment, the center 31*c* of gravity of the capacitor 31 is disposed so as to be deviated from the center 11*c* of gravity of the base plate 11 toward +X direction side that is one side in the X direction. Meanwhile, since each of the base plate 11 and the capacitor 31 has a rectangular shape when seen in the Z direction, the centers 11*c* and 31*c* of gravity of the base plate and the capacitor are intersections between virtual diagonal lines of the respective outer edges of the rectangular shapes of the base plate and capacitor when seen in the Z direction.

Figure 7:
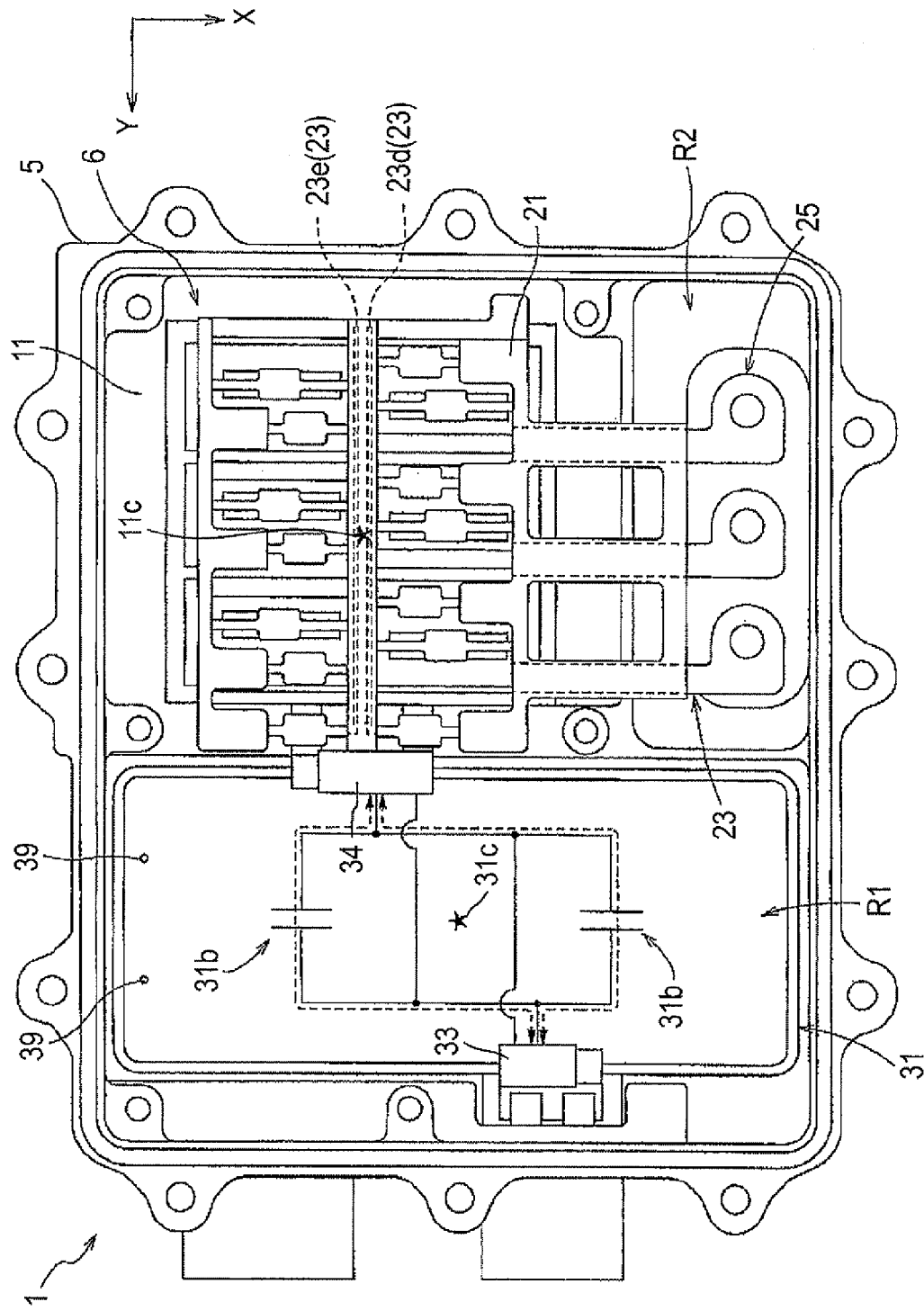
FIG. 7 is a schematic view showing the configuration of an electrical circuit that is provided in a capacitor.

Here, in this embodiment, as shown in FIG. 7, the DC terminals 34 are disposed at the position of the center 11*c* of gravity of the base plate 11 in the X direction in accordance with the positions of the bus bars 23*d* and 23*e* in the X direction. The reason for this is that it is possible to make the shapes of the bus bars 23*d* and 23*e*, which connect the DC terminals 34 to the respective switching elements 14, be the same as each other or substantially the same as each other in this case. For this reason, in this embodiment, the position of the center 31c of gravity of the capacitor 31 in the X direction is disposed so as to be deviated from the DC terminals 34 toward +X direction side.

In this structure, in this embodiment, the power supply terminals 33 and the DC terminals 34 are disposed at the positions that are point-symmetrical to each other with respect to the center 31c of gravity of the capacitor 31 when seen in the Z direction. That is, the power supply terminals 33 are disposed at the positions that are point-symmetrical to the DC terminals 34 with respect to the center 31c of gravity of the capacitor 31 as a reference point. That is, the power supply terminals 33 are disposed at any positions on the peripheral edge portion of the case portion 31a of the capacitor 31 and at the positions on a virtual plane passing through the DC terminals 34 and the center 31c of gravity of the capacitor 31. In this case, an offset distance from the DC terminal 34 to the center 31c of gravity of the capacitor 31 in the X direction (the length in the X direction) is substantially equal to an offset distance from the center 31c of gravity of the capacitor 31 to the power supply terminal 33. Meanwhile, in this case, the power supply terminals 33 and the DC terminals 34 are naturally disposed at positions that are different in the X direction.

Since the above-mentioned configuration of the power supply terminals 33 and the DC terminals 34 has been employed in this embodiment, it is possible to make the lengths of electrical connection paths, which pass through the capacitor bus bars 36a and 36b and the respective capacitor elements 31b provided between the power supply terminals 33 and the DC terminals 34, be substantially equal to each other in the structure where a plurality of (two in this embodiment) capacitor elements 31b are connected in parallel between the power supply terminals 33 and the DC terminals 34. This is schematically shown in FIG. 7. Accordingly, it is possible to substantially equalize the currents that flow through the respective capacitor elements 31b. Further, since the amount of heat generated by the respective capacitor elements 31b is also substantially equalized due to this, it is possible to reduce the size of each of the capacitor elements 31b and thus to reduce the entire size of the inverter device 1 and the capacitor 31.

4. Configuration in State where Inverter Device is Mounted on Vehicle

As apparent from the description having been made until now, the extending direction of the flat plate-like heat dissipating fins 11b provided on the base plate 11 has been the direction along the Y direction in this embodiment. Further, the capacitor 31 is disposed adjacent to the base plate 11, which includes the heat dissipating fins 11b, on +Y direction side. Furthermore, the power supply terminals 33 are formed integrally with a wall portion, which corresponds to +Y direction side, of the case portion 31a of the capacitor 31. Moreover, the three rotary electric machine-connection terminals 25a, 25b, and 25c are sequentially arrayed in the direction parallel to the Y direction.

Meanwhile, the vehicle drive device 62 according to this embodiment is mounted on a FF (Front Engine Front Drive) type hybrid vehicle V as shown in FIG. 8, and is disposed adjacent to an internal combustion engine 61, which is transversely mounted in a driving power source receiving chamber (engine room) provided on the front side of a driver's seat, so as to be lined up in the width direction of the vehicle V. The rotating shaft 3a of the rotary electric machine 3, which is included in the vehicle drive device 62, is disposed parallel to a crankshaft of the internal combustion engine 61, and is connected to the crankshaft so as to be driven. That is, the crankshaft of the internal combustion engine 61 and the rotating shaft 3a of the rotary electric machine 3 are disposed in the width direction of the vehicle V, and are disposed perpendicular to the travel direction T of the vehicle V.

In this structure, the inverter device 1 according to this embodiment is fixed to the upper portion of the vehicle drive device 62 and mounted on the vehicle V in the following state. Here, the X direction, which has been described until now, corresponds with the width direction of the vehicle V, that is, a direction parallel to the rotating shaft 3a of the rotary electric machine 3. Further, the Y direction corresponds with the travel direction T of the vehicle V, that is, a direction perpendicular to the rotating shaft 3a of the rotary electric machine 3. Meanwhile, in this embodiment, −Y direction side corresponds with the front side in the travel direction T of the vehicle V and +Y direction side corresponds with the rear side in the travel direction T of the vehicle V. The Z direction may be slightly inclined with respect to the travel direction T of the vehicle V, but corresponds with a substantially vertical direction (see FIG. 1).

Accordingly, in the state where the inverter device is mounted on the vehicle V in this embodiment, the extending direction of the flat plate-like heat dissipating fins 11b provided on the base plate 11 of the inverter device 1 is a direction along the travel direction T of the vehicle V and the capacitor 31 is disposed adjacent to the heat dissipating fins 11b on the rear side in the travel direction T of the vehicle V. Therefore, travel wind, which is generated due to the forward travel of the vehicle V, is appropriately guided to the spaces between the plurality of heat dissipating fins 11b, so that it is possible to efficiently dissipate heat from the heat dissipating fins 11b. As a result, it is possible to efficiently cool the switching elements 14. Further, since the travel wind flowing between the heat dissipating fins 11b is appropriately guided to the capacitor 31, it is also possible to efficiently cool the capacitor 31.

Here, the heat dissipating fins 11b provided on the base plate 11 are provided on the side opposite to the vehicle drive device 62 and the rotary electric machine 3 with respect to the element placing surface 11a, here, on the upper side of the base plate in the vertical direction. Accordingly, the heat dissipating fins 11b are disposed at the position distant from the vehicle drive device 62 and the rotary electric machine 3 which generate a relatively large amount of heat. Therefore, since the heat dissipating fins are not easily affected by the heat generated by the rotary electric machine 3 and cooling air is easily supplied to the heat dissipating fins 11b, heat is efficiently dissipated from the base plate 11 by the heat dissipating fins 11b. As a result, it is possible to efficiently cool the switching elements 14.

Further, the power supply terminals 33 are disposed on the rear side of the capacitor 31 or the inverter module 6 (see FIGS. 3 and 4, and the like), which includes the three rotary electric machine-connection terminals 25a, 25b, and 25c, in the travel direction T of the vehicle V. In this embodiment, as shown in FIG. 8, the power supply terminals 33 are disposed at the position of the rearmost end portion of the case in the travel direction T of the vehicle V. The battery 2 is connected to the power supply terminals 33 through electric power lines or the like.

Here, there are many cases where the battery 2, which tends to be relatively large, is generally mounted on the vehicle on the rear side of the driving power source receiving chamber (engine room), such as below seats of the vehicle V, in a center tunnel, in a trunk room, or the like as shown even in FIG. 8. In this respect, in the above-mentioned structure, the power supply terminals 33 are provided at the position of the rearmost end portion of the case in the travel direction T of the vehicle V. Accordingly, it is possible to electrically connect the power supply terminals 33 to the battery 2 with the shortest path. Therefore, it is possible to simplify the electrical connection structure between the inverter device 1 and the battery 2.

Moreover, in the state where the inverter device is mounted on the vehicle V in this embodiment, the three rotary electric machine-connection terminals 25a, 25b, and 25c are disposed on the same side of the base plate 11 in the width direction of the vehicle. Further, the three rotary electric machine-connection terminals 25a, 25b, and 25c are sequentially arrayed in the travel direction T of the vehicle V, that is, in the direction perpendicular to the rotating shaft 3a of the rotary electric machine 3. Furthermore, in this embodiment, the rotary electric machine-connection terminals 25a, 25b, and 25c are disposed so as to overlap the coils 3b of the rotary electric machine 3 (here, particularly, coil end portions that are portions protruding in an axial direction from stators of the rotary electric machine 3) when seen in a radial direction of the rotary electric machine 3. In this embodiment, the rotary electric machine-connection terminals 25a, 25b, and 25c are disposed on the upper side of the vehicle drive device 62, which includes the rotary electric machine 3, in the vertical direction so as to overlap the coils 3b of the rotary electric machine 3 in plan view seen in the vertical direction. Accordingly, it is possible to connect the rotary electric machine-connection terminals 25a, 25b, and 25c to the coils 3b of the rotary electric machine 3 along the radial direction of the rotary electric machine 3 in the shape of a straight line on the same side in the axial direction of the rotary electric machine 3. Therefore, it is possible to electrically connect the rotary electric machine-connection terminals 25a, 25b, and 25c to the coils 3b by a minimum number of necessary members, so that it is possible to simplify the electrical connection structure between the inverter device 1 and the coils 3b.

As described above, in the inverter device 1 according to this embodiment, the disposition positions of the respective components of the inverter device 1 are optimized in consideration of the state where the inverter device is mounted on the vehicle V. Accordingly, it is possible to simplify both the electrical connection structure between the inverter device 1 and the rotary electric machine 3 and the electrical connection structure between the inverter device 1 and the battery 2, and to secure the performance for cooling the switching elements 14, the capacitor 31, or the like.

5. Other Embodiments

Finally, other embodiments of the inverter device according to the invention will be described. Meanwhile, as long as there is no inconsistency, structures disclosed in the following respective embodiments may be combined with structures disclosed in other embodiments in order to be applied.

(1) A case where the length and position of the capacitor disposition area R1 in the X direction are set so as to correspond with the length and position of the base disposition area R2 in the X direction has been described by way of example in the above-mentioned embodiment. However, the embodiment of the invention is not limited thereto. That is, for example, a structure where the lengths of the capacitor disposition area R1 and the base disposition area R2 in the X direction are set so as not to correspond with each other is also one preferred embodiment of the invention. In this case, a structure where the position of only one of both end portions of the capacitor disposition area R1 in the X direction is set so as to correspond with the position of only one of both end portions of the base disposition area R2 in the X direction, or a structure where the positions of both end portions of the capacitor disposition area R1 in the X direction are set so as not to correspond with the positions of both end portions of the base disposition area R2 in the X direction may be employed. Alternatively, a structure where the lengths of the capacitor disposition area R1 and the base disposition area R2 in the X direction are set so as to correspond with each other and the positions of both end portions of the capacitor disposition area R1 in the X direction are set so as not to correspond with the positions of both end portions of the base disposition area R2 in the X direction is also one preferred embodiment of the invention.

(2) A case where the length and position of the capacitor disposition area R1 in the Z direction are set so as to correspond with the length and position of the base disposition area R2 in the Z direction has been described by way of example in the above-mentioned embodiment. However, the embodiment of the invention is not limited thereto. That is, for example, a structure where the lengths of the capacitor disposition area R1 and the base disposition area R2 in the Z direction are set so as not to correspond with each other is also one preferred embodiment of the invention. In this case, a structure where the position of only one of both end portions of the capacitor disposition area R1 in the Z direction is set so as to correspond with the position of only one of both end portions of the base disposition area R2 in the Z direction, or a structure where the positions of both end portions of the capacitor disposition area R1 in the Z direction are set so as not to correspond with the positions of both end portions of the base disposition area R2 in the Z direction may be employed. Alternatively, a structure where the lengths of the capacitor disposition area R1 and the base disposition area R2 in the Z direction are set so as to correspond with each other and the positions of both end portions of the capacitor disposition area R1 in the Z direction are set so as not to correspond with the positions of both end portions of the base disposition area R2 in the Z direction is also one preferred embodiment of the invention.

(3) A case where the control board 41 is disposed adjacent to both the capacitor disposition area R1 and the base disposition area R2 in the Z direction has been described by way of example in the above-mentioned embodiment. However, the embodiment of the invention is not limited thereto. That is, for example, a structure where the control board 41 is disposed so as to be distant from the capacitor disposition area R1 and the base disposition area R2 in the Z direction to some extent is also one preferred embodiment of the invention.

(4) A case where the branch connection portions 39 branched and extending from the capacitor bus bars 36a and 36b are connected to the voltage detecting circuit 44 while passing through the control board 41 has been described by way of example in the above-mentioned embodiment. However, the embodiment of the invention is not limited thereto. That is, a structure where the branch connection portions 39 go around the control board 41 and are connected to the voltage detecting circuit 44 without passing through the control board 41 is also one preferred embodiment of the invention.

(5) A case where the power supply terminals 33 are disposed at the positions point-symmetrical to the DC terminals 34 with respect to the center 31c of gravity of the capacitor 31 as a reference point and are disposed on the rear side of the rotary electric machine-connection terminals 25a, 25b, and 25c or the capacitor 31 in the travel direction T of the vehicle V has been described by way of example in the above-mentioned embodiment. However, the embodiment of the invention is not limited thereto. That is, the disposition positions of the power supply terminals 33 may be arbitrarily set regardless of the disposition positions of the DC terminals 34 or the center 31*c* of gravity of the capacitor 31.

(6) A case where the rotary electric machine-connection terminals 25*a*, 25*b*, and 25*c* are sequentially arrayed in the direction perpendicular to the rotating shaft 3*a* of the rotary electric machine 3 and are disposed so that the end portions of the rotary electric machine-connection terminals corresponding to +X direction side are aligned with each other has been described by way of example in the above-mentioned embodiment. However, the embodiment of the invention is not limited thereto. That is, for example, a structure where the rotary electric machine-connection terminals 25*a*, 25*b*, and 25*c* are sequentially arrayed in a direction crossing (inclined with respect to) the rotating shaft 3*a* of the rotary electric machine 3 and the end portions of the rotary electric machine-connection terminals corresponding to +X direction side are disposed so as to be lined up in the shape of a straight line in the direction crossing (inclined with respect to) the rotating shaft 3*a* of the rotary electric machine 3 is also one preferred embodiment of the invention. Further, in regard to the positions of the respective end portions of the rotary electric machine-connection terminals 25*a*, 25*b*, and 25*c* corresponding to +X direction side, a structure where the end portions of the rotary electric machine-connection terminals are disposed so that a virtual line sequentially connecting the end portions of the rotary electric machine-connection terminals from one side toward the other side in the Y direction has the shape of a broken line is also one preferred embodiment of the invention.

(7) A case where a direction in which the upper and lower stage arms of each of the legs are connected to each other is the direction along the X direction and the three legs are sequentially arrayed in the Y direction has been described by way of example in the above-mentioned embodiment. However, the embodiment of the invention is not limited thereto. That is, for example, a structure where a direction in which the upper and lower stage arms of each of the legs are connected to each other is a direction along the Y direction and the three legs are sequentially arrayed in the X direction is also one preferred embodiment of the invention.

(8) A case where the upper and lower stage arms are disposed so that the longitudinal direction of each of the upper and lower stage arms is the direction along the X direction has been described by way of example in the above-mentioned embodiment. However, the embodiment of the invention is not limited thereto. That is, for example, a structure where the upper and lower stage arms are disposed so that the longitudinal direction of each of the upper and lower stage arms is the direction along the Y direction is also one preferred embodiment of the invention.

(9) A case where the heat dissipating fins 11*b* are provided on the side opposite to the vehicle drive device 62 and the rotary electric machine 3 with respect to the element placing surface 11*a* (on the upper side in the vertical direction) has been described by way of example in the above-mentioned embodiment. However, the embodiment of the invention is not limited thereto. That is, for example, a structure where the heat dissipating fins 11*b* are provided on the same side as the vehicle drive device 62 and the rotary electric machine 3 with respect to the element placing surface 11*a* (on the lower side in the vertical direction) is also one preferred embodiment of the invention.

(10) A case where the extending direction of the heat dissipating fins 11*b* is set to the direction along the travel direction T of the vehicle V and the capacitor 31 is disposed adjacent to the heat dissipating fins 11*b* on the rear side in the travel direction T of the vehicle V in order to use travel wind generated due to the travel of the vehicle V has been described by way of example in the above-mentioned embodiment. However, the embodiment of the invention is not limited thereto. That is, for example, a structure where the extending direction of the heat dissipating fins 11*b* is set to a direction crossing the travel direction T of the vehicle V (including a direction perpendicular to the travel direction T of the vehicle V) when the capacitor 31 is disposed adjacent to the heat dissipating fins 11*b* on the rear side in the travel direction T of the vehicle V is also one preferred embodiment of the invention.

(11) A case where the inverter device 1 is mounted on the vehicle V so as to be integrated with the vehicle drive device 62 and the rotary electric machine-connection terminals 25*a*, 25*b*, and 25*c* are disposed so as to overlap the coils 3*b* when seen in the radial direction of the rotary electric machine 3 has been described by way of example in the above-mentioned embodiment. However, the embodiment of the invention is not limited thereto. That is, for example, a structure where the vehicle drive device 62 and the inverter device 1 are mounted on the vehicle V so as to be physically separated from each other is also one preferred embodiment of the invention.

(12) Even in regard to other structures, the embodiment disclosed in this specification is illustrative in all aspects and the embodiment of the invention is not limited thereto. That is, structures that are not disclosed in claims of this application may be appropriately modified within a range that does not depart from the object of the invention.

The invention may be used suitable for an inverter device including a plurality of switching elements that convert electric power between DC power and AC power, a base plate that includes an element placing surface on which these plurality of switching elements are placed, heat dissipating fins that are provided on the side of the base plate opposite to the element placing surface, a plurality of AC phase-terminals as AC terminals that input and output AC power to and from a rotary electric machine as a driving power source of a vehicle, and a capacitor that smoothes DC power.

What is claimed is:

1. An inverter device including a plurality of switching elements that convert electric power between DC power and AC power, a base plate that includes an element placing surface on which the plurality of switching elements are placed, heat dissipating fins that are provided on the side of the base plate opposite to the element placing surface, AC terminals through which AC power is input and output to and from a rotary electric machine as a driving power source of a vehicle and which are electrically connected to the switching elements, and a capacitor that smoothes DC power, the inverter device being fixed to a rotary electric machine case that receives the rotary electric machine, wherein a rotating shaft of the rotary electric machine is disposed so as to extend in a width direction of the vehicle, the base plate is disposed adjacent to the AC terminals in the width direction of the vehicle, a plurality of AC phase-terminals as the AC terminals are sequentially arrayed in a direction perpendicular to the rotating shaft of the rotary electric machine, and the capacitor is disposed adjacent to the heat dissipating fins on the rear side in a travel direction of the vehicle.

2. The inverter device according to claim 1,
wherein the heat dissipating fins are disposed on the side opposite to the rotary electric machine with respect to the element placing surface.

3. The inverter device according to claim 2,
wherein an extending direction of the heat dissipating fins, which extend in the shape of a flat plate, is set so as to be a direction along a travel direction of the vehicle.

4. The inverter device according to claim 3, further comprising:
power supply terminals which are connected to the capacitor and through which DC power is input and output to and from a DC power source,
wherein the power supply terminals are disposed on the rear side of the capacitor in the travel direction of the vehicle.

5. The inverter device according to claim 4,
wherein the plurality of AC phase-terminals are disposed at positions that overlap coils of the rotary electric machine when seen in a radial direction of the rotary electric machine.

6. The inverter device according to claim 5,
wherein the AC terminals are disposed so as to protrude from the base plate in a predetermined first reference direction in plan view seen in a direction perpendicular to the element placing surface,
the capacitor is disposed in a capacitor disposition area that is set in a rectangular shape in the plan view, and
the capacitor disposition area is set so that long sides of the rectangular shape are parallel to the first reference direction in the plan view, and is set adjacent to a base disposition area, in which the base plate and the AC terminals are disposed, in a second reference direction that is a direction perpendicular to the first reference direction.

7. The inverter device according to claim 6,
wherein the length of the capacitor disposition area in the first reference direction is set so as to be longer than the length of the base plate in the first reference direction, and
the AC terminals are disposed in an area overlapping the capacitor disposition area when seen in the second reference direction.

8. The inverter device according to claim 7,
wherein a connecting support, which supports electrical connection members electrically connecting at least the switching elements to the AC terminals, is provided on the same side of the base plate as the element placing surface,
the base disposition area is set so as to include disposition areas of the heat dissipating fins and the connecting support, and
the length and position of the capacitor disposition area in a perpendicular reference direction, which is a direction perpendicular to the element placing surface, are set so as to correspond with the length and position of the base disposition area in the perpendicular reference direction.

9. The inverter device according to claim 8, further comprising:
a control board that is provided with at least a drive circuit for the switching elements,
wherein the control board is adjacent to both the capacitor disposition area and the base disposition area in a perpendicular reference direction, which is a direction perpendicular to the element placing surface, and is disposed at a position overlapping both the capacitor disposition area and the base disposition area in the plan view.

10. The inverter device according to claim 9, further comprising:
power supply terminals through which DC power is input and output to and from a DC power source;
DC terminals through which DC power is input and output to and from the switching elements; and
capacitor connecting members that electrically connect the power supply terminals to the DC terminals through the capacitor,
wherein the control board is further provided with a voltage detecting circuit that detects a voltage between both electrodes of the capacitor, and
branch connection portions, which are branched from the capacitor connecting members and extend in the perpendicular reference direction, are connected to the voltage detecting circuit while passing through the control board.

11. The inverter device according to claim 10,
wherein the power supply terminals and the DC terminals are disposed at positions that are different in the first reference direction and point-symmetrical to each other with respect to the center of gravity of the shape of the capacitor disposition area in the plan view.

12. The inverter device according to claim 11,
wherein the plurality of switching elements form an inverter circuit,
the inverter circuit has a three-leg structure including three legs that include switching elements forming upper stage arms connected to the side of a positive electrode and switching elements forming lower stage arms connected to the side of a negative electrode, and
a direction in which the upper and lower stage arms of each of the legs are connected to each other is a direction along the first reference direction, and the three legs are sequentially arrayed in the second reference direction.

13. The inverter device according to claim 12,
wherein the upper and lower stage arms are disposed so that a longitudinal direction of each of the upper and lower stage arms is a direction along the first reference direction.

14. The inverter device according to claim 2, further comprising:
power supply terminals which are connected to the capacitor and through which DC power is input and output to and from a DC power source,
wherein the power supply terminals are disposed on the rear side of the capacitor in the travel direction of the vehicle.

15. The inverter device according to claim 2,
wherein the plurality of AC phase-terminals are disposed at positions that overlap coils of the rotary electric machine when seen in a radial direction of the rotary electric machine.

16. The inverter device according to claim 2,
wherein the AC terminals are disposed so as to protrude from the base plate in a predetermined first reference direction in plan view seen in a direction perpendicular to the element placing surface,
the capacitor is disposed in a capacitor disposition area that is set in a rectangular shape in the plan view, and
the capacitor disposition area is set so that long sides of the rectangular shape are parallel to the first reference direction in the plan view, and is set adjacent to a base disposition area, in which the base plate and the AC terminals are disposed, in a second reference direction that is a direction perpendicular to the first reference direction.

17. The inverter device according to claim 1,
wherein an extending direction of the heat dissipating fins, which extend in the shape of a flat plate, is set so as to be a direction along a travel direction of the vehicle.

18. The inverter device according to claim 1, further comprising:
power supply terminals which are connected to the capacitor and through which DC power is input and output to and from a DC power source,
wherein the power supply terminals are disposed on the rear side of the capacitor in the travel direction of the vehicle.

19. The inverter device according to claim 1,
wherein the plurality of AC phase-terminals are disposed at positions that overlap coils of the rotary electric machine when seen in a radial direction of the rotary electric machine.

20. The inverter device according to claim 1,
wherein the AC terminals are disposed so as to protrude from the base plate in a predetermined first reference direction in plan view seen in a direction perpendicular to the element placing surface,
the capacitor is disposed in a capacitor disposition area that is set in a rectangular shape in the plan view, and
the capacitor disposition area is set so that long sides of the rectangular shape are parallel to the first reference direction in the plan view, and is set adjacent to a base disposition area, in which the base plate and the AC terminals are disposed, in a second reference direction that is a direction perpendicular to the first reference direction.

21. The inverter device according to claim 20,
wherein the length of the capacitor disposition area in the first reference direction is set so as to be longer than the length of the base plate in the first reference direction, and
the AC terminals are disposed in an area overlapping the capacitor disposition area when seen in the second reference direction.

22. The inverter device according to claim 20,
wherein a connecting support, which supports electrical connection members electrically connecting at least the switching elements to the AC terminals, is provided on the same side of the base plate as the element placing surface,
the base disposition area is set so as to include disposition areas of the heat dissipating fins and the connecting support, and
the length and position of the capacitor disposition area in a perpendicular reference direction, which is a direction perpendicular to the element placing surface, are set so as to correspond with the length and position of the base disposition area in the perpendicular reference direction.

23. The inverter device according to claim 20, further comprising:
a control board that is provided with at least a drive circuit for the switching elements,
wherein the control board is adjacent to both the capacitor disposition area and the base disposition area in a perpendicular reference direction, which is a direction perpendicular to the element placing surface, and is disposed at a position overlapping both the capacitor disposition area and the base disposition area in the plan view.

24. The inverter device according to claim 20,
wherein the plurality of switching elements form an inverter circuit,
the inverter circuit has a three-leg structure including three legs that include switching elements forming upper stage arms connected to the side of a positive electrode and switching elements forming lower stage arms connected to the side of a negative electrode, and
a direction in which the upper and lower stage arms of each of the legs are connected to each other is a direction along the first reference direction, and the three legs are sequentially arrayed in the second reference direction.

25. The inverter device according to claim 24,
wherein the upper and lower stage arms are disposed so that a longitudinal direction of each of the upper and lower stage arms is a direction along the first reference direction.

* * * * *